United States Patent
Carney et al.

(10) Patent No.: US 11,211,359 B2
(45) Date of Patent: Dec. 28, 2021

(54) SEMICONDUCTOR DEVICE AND METHOD OF FORMING MODULAR 3D SEMICONDUCTOR PACKAGE WITH HORIZONTAL AND VERTICAL ORIENTED SUBSTRATES

(71) Applicant: SEMICONDUCTOR COMPONENTS INDUSTRIES, LLC, Phoenix, AZ (US)

(72) Inventors: Francis J. Carney, Mesa, AZ (US); Michael J. Seddon, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 375 days.

(21) Appl. No.: 15/364,715

(22) Filed: Nov. 30, 2016

(65) Prior Publication Data

US 2017/0084577 A1 Mar. 23, 2017

Related U.S. Application Data

(63) Continuation-in-part of application No. 15/218,974, filed on Jul. 25, 2016, now Pat. No. 10,090,233.
(Continued)

(51) Int. Cl.
*H01L 25/065* (2006.01)
*H01L 21/768* (2006.01)
(Continued)

(52) U.S. Cl.
CPC ........ *H01L 25/0652* (2013.01); *H01L 21/486* (2013.01); *H01L 21/76877* (2013.01);
(Continued)

(58) Field of Classification Search
CPC ............ H01L 21/486; H01L 21/76877; H01L 2224/03
(Continued)

(56) References Cited

U.S. PATENT DOCUMENTS 5,544,017 A * 8/1996 Beilin ............... H01L 23/49838
174/255
7,608,919 B1 10/2009 Bernstein et al.
(Continued)

OTHER PUBLICATIONS

Jason Kulick et al., "Indiana Integrated Circuits, LLC and Quilt Packaging® Technology: An Overview," Indiana Integrated Circuits, LLC, May 2016, 42 pages.

*Primary Examiner* — Dale E Page
*Assistant Examiner* — Wilner Jean Baptiste
(74) *Attorney, Agent, or Firm* — Adam R. Stephenson, Ltd.

(57) ABSTRACT

A semiconductor device has a plurality of interconnected modular units to form a 3D semiconductor package. Each modular unit is implemented as a vertical component or a horizontal component. The modular units are interconnected through a vertical conduction path and lateral conduction path within the vertical component or horizontal component. The vertical component and horizontal component each have an interconnect interposer or semiconductor die. A first conductive via is formed vertically through the interconnect interposer. A second conductive via is formed laterally through the interconnect interposer. The interconnect interposer can be programmable. A plurality of protrusions and recesses are formed on the vertical component or horizontal component, and a plurality of recesses on the vertical component or horizontal component. The protrusions are inserted into the recesses to interlock the vertical component and horizontal component. The 3D semiconductor package
(Continued)

can be formed with multiple tiers of vertical components and horizontal components.

17 Claims, 21 Drawing Sheets

Related U.S. Application Data

(60) Provisional application No. 62/219,666, filed on Sep. 17, 2015.

(51) Int. Cl.
*H01L 25/00* (2006.01)
*H01L 21/48* (2006.01)
*H01L 25/18* (2006.01)
*H01L 23/00* (2006.01)
*H01L 29/06* (2006.01)
H01L 23/13 (2006.01)

(52) U.S. Cl.
CPC ............. *H01L 24/05* (2013.01); *H01L 24/16* (2013.01); *H01L 25/0655* (2013.01); *H01L 25/0657* (2013.01); *H01L 25/18* (2013.01); *H01L 25/50* (2013.01); *H01L 29/0657* (2013.01); *H01L 23/13* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/0557* (2013.01); *H01L 2224/0558* (2013.01); *H01L 2224/05573* (2013.01); *H01L 2224/05611* (2013.01); *H01L 2224/05624* (2013.01); *H01L 2224/05639* (2013.01); *H01L 2224/05647* (2013.01); *H01L 2224/05655* (2013.01); *H01L 2224/05666* (2013.01); *H01L 2224/06181* (2013.01); *H01L 2224/11002* (2013.01); *H01L 2224/16137* (2013.01); *H01L 2224/81005* (2013.01); *H01L 2224/81815* (2013.01); *H01L 2224/94* (2013.01); *H01L 2225/06506* (2013.01); *H01L 2225/06513* (2013.01); *H01L 2225/06517* (2013.01); *H01L 2225/06548* (2013.01); *H01L 2225/06551* (2013.01); *H01L 2225/06572* (2013.01); *H01L 2225/06589* (2013.01); *H01L 2924/1033* (2013.01); *H01L 2924/10252* (2013.01); *H01L 2924/10253* (2013.01); *H01L 2924/10272* (2013.01); *H01L 2924/10322* (2013.01); *H01L 2924/10329* (2013.01); *H01L 2924/10335* (2013.01); *H01L 2924/141* (2013.01); *H01L 2924/143* (2013.01); *H01L 2924/1421* (2013.01); *H01L 2924/1431* (2013.01); *H01L 2924/1433* (2013.01); *H01L 2924/14335* (2013.01); *H01L 2924/15159* (2013.01); *H01L 2924/19104* (2013.01); *H01L 2924/3511* (2013.01); *H01L 2924/3512* (2013.01); *H01L 2924/35121* (2013.01)

(58) Field of Classification Search
USPC .......................................... 257/735
See application file for complete search history.

(56) References Cited

U.S. PATENT DOCUMENTS

| | | | |
|---|---|---|---|
| 9,633,976 | B1 | 4/2017 | Bernstein et al. |
| 2005/0051903 | A1* | 3/2005 | Ellsberry .......... H01L 23/49816 257/777 |
| 2006/0148250 | A1* | 7/2006 | Kirby ................ H01L 21/76898 438/667 |
| 2007/0281077 | A1* | 12/2007 | Hock ..................... H01L 21/565 427/98.6 |
| 2012/0129276 | A1* | 5/2012 | Haensch ................. B32B 37/02 438/7 |
| 2012/0148250 | A1* | 6/2012 | Xu .......................... H04J 14/02 398/67 |
| 2012/0273971 | A1* | 11/2012 | Usami ................... H01L 21/561 257/777 |
| 2014/0049932 | A1* | 2/2014 | Camarota ............. H01L 23/145 361/807 |
| 2016/0043054 | A1* | 2/2016 | Fischer ............... H01L 25/0655 438/107 |
| 2016/0240510 | A1* | 8/2016 | Lien .................. H01L 23/49805 |
| 2017/0179093 | A1 | 6/2017 | Hall et al. |

* cited by examiner

US 11,211,359 B2

SEMICONDUCTOR DEVICE AND METHOD OF FORMING MODULAR 3D SEMICONDUCTOR PACKAGE WITH HORIZONTAL AND VERTICAL ORIENTED SUBSTRATES

CLAIM TO DOMESTIC PRIORITY

The present application is a continuation-in-part of U.S. patent application Ser. No. 15/218,974, filed Jul. 25, 2016, which claims the benefit of U.S. Provisional Application No. 62/219,666, filed Sep. 17, 2015, and which applications are incorporated herein by reference and priority thereto for common subject matter is hereby claimed.

FIELD OF THE INVENTION

The present invention relates in general to semiconductor devices and, more particularly, to a semiconductor device and method of forming a modular 3D semiconductor package.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), standard logic, amplifiers, clock management, memory, interface circuits, and various signal processing circuits.

An important aspect of semiconductor devices is the area required for interconnect structures between semiconductor die. FIG. 1 shows a known inter-die interconnect arrangement with semiconductor die 50 disposed adjacent to, but separated from, semiconductor die 52. Bond wire 54 provides electrical interconnect between contact pad 56 on active surface 58 of semiconductor die 50 and contact pad 60 on active surface 62 of semiconductor die 52. Bond wire 54 requires separation of distance D1 between semiconductor die 50 and 52, as well as dedicated edge space D2 in order to form and shape the bond wire. In addition, semiconductor die often reserve dedicated edge space for the scribe grid to account for saw variation, crack stop trench to account for crack propagation from the saw street, or die edge seal to account for saw cracks and eventually moisture from entering near the active area. The die edge space requirements remain a problem. It is desirable to reduce dedicated edge space required for electric interconnect in order to maximize the active die area providing signal processing functions for a given semiconductor package, as well as reduce the overall footprint of the semiconductor package.

Die stacking has been used to minimize semiconductor package footprint and is useful for low power technologies, such as memory devices. However, heat dissipation and excessive stress have been problems with stacked die, particularly for power MOSFETs and integrated drivers. Another common approach for inter-die interconnect is to use through silicon vias (TSVs), which are costly to manufacture.

Most semiconductor die are designed to fit into a standard semiconductor package. In the case of multiple semiconductor die in one package, the layout is often limited to simple vertical stacking of the semiconductor die with specialized vertical interconnect structures. The semiconductor package may need to be customized to accommodate more complex configurations and interconnect of multiple semiconductor die. Custom semiconductor packages are inherently more costly and time consuming to design and manufacture.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. The wafer is singulated using plasma etching, laser cutting tool, or saw blade along non-functional regions of the wafer called saw streets or scribes. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2A:
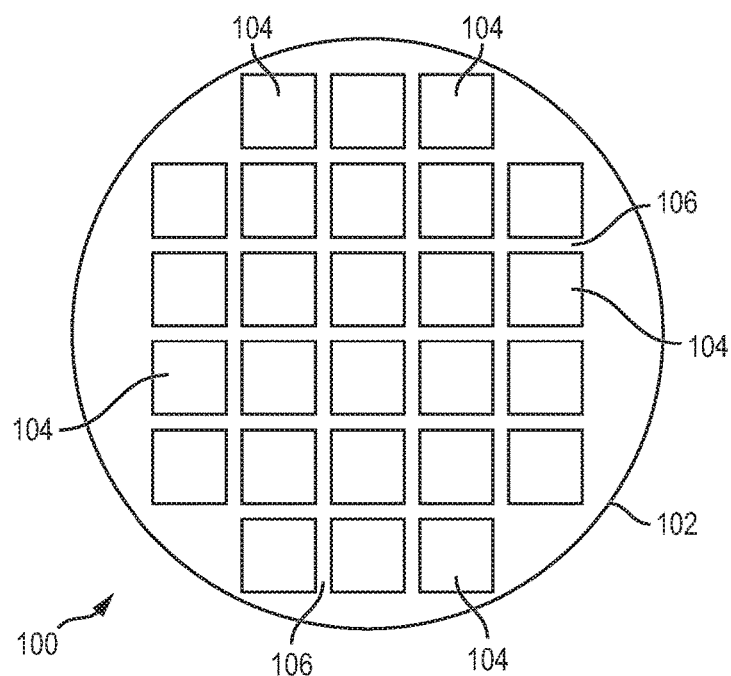
FIGS. 2a-2d illustrate a semiconductor wafer with a plurality of semiconductor die separated by a saw street.

FIG. 2a shows semiconductor wafer 100 with a base substrate material 102, such as silicon, germanium, aluminum phosphide, aluminum arsenide, gallium arsenide, gallium nitride, indium phosphide, silicon carbide, or other bulk semiconductor material for structural support. A plurality of semiconductor die or components 104 is formed on wafer 100 separated by a non-active, inter-die wafer area or saw street 106, as described above. Saw street 106 provides cutting areas to singulate semiconductor wafer 100 into individual semiconductor die 104. In one embodiment, semiconductor wafer 100 has a width or diameter of 100-450 millimeters (mm) and thickness of 50-100 micrometers (µm) or 15-250 µm.

Figure 2B:
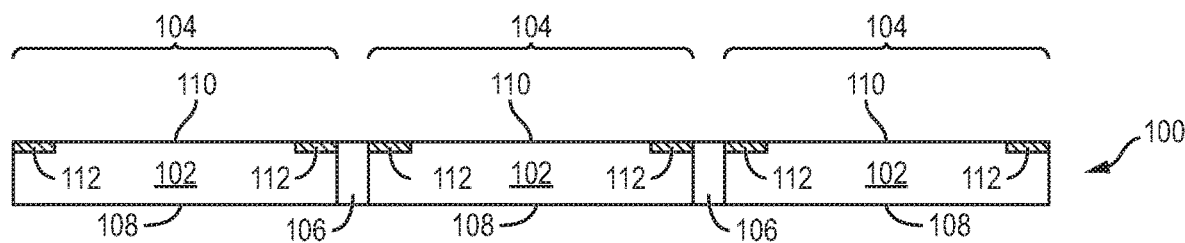

FIG. 2b shows a cross-sectional view of a portion of semiconductor wafer 100. Each semiconductor die 104 has a back or non-active surface 108 and an active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), microcontrollers, ASIC, standard logic, amplifiers, clock management, memory, interface circuits, and other signal processing circuit. Semiconductor die 104 may also contain integrated passive devices (IPDs), such as inductors, capacitors, and resistors, for RF signal processing. Active surface 110 may contain an image sensor area implemented as semiconductor charge-coupled devices (CCD) and active pixel sensors in complementary metal-oxide-semiconductor (CMOS) or N-type metal-oxide-semiconductor (NMOS) technologies. Alternatively, semiconductor die 104 can be an optical lens, detector, vertical cavity surface emitting laser (VCSEL), waveguide, stacked die, electromagnetic (EM) filter, or multi-chip module.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), titanium (Ti), titanium tungsten (TiW), or other suitable electrically conductive material. Conductive layer 112 operates as inter-die contact pads electrically connected to the circuits on active surface 110. In one embodiment, conductive layer 112 is formed at or near the edge of semiconductor die 104.

Semiconductor wafer 100 undergoes electrical testing and inspection as part of a quality control process. Manual visual inspection and automated optical systems are used to perform inspections on semiconductor wafer 100. Software can be used in the automated optical analysis of semiconductor wafer 100. Visual inspection methods may employ equipment such as a scanning electron microscope, high-intensity or ultra-violet light, or metallurgical microscope. Semiconductor wafer 100 is inspected for structural characteristics including warpage, thickness variation, surface particulates, irregularities, cracks, delamination, and discoloration.

Figure 2C:
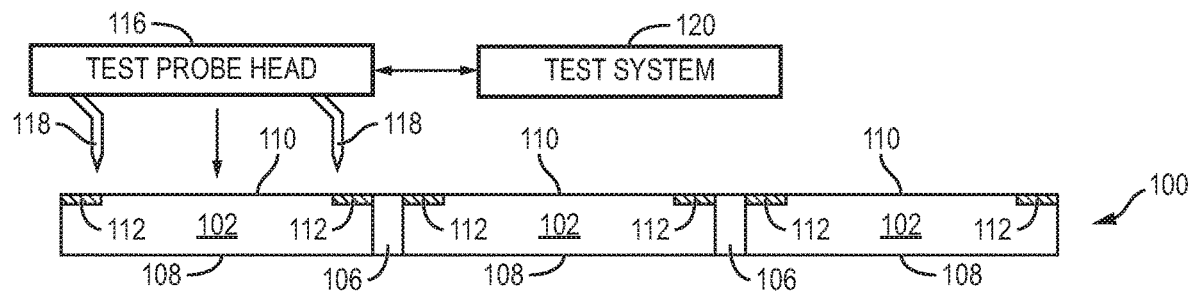

The active and passive components within semiconductor die 104 undergo testing at the wafer level for electrical performance and circuit function. Each semiconductor die 104 is tested for functionality and electrical parameters, as shown in FIG. 2c, using a test probe head 116 including a plurality of probes or test leads 118, or other testing device. Probes 118 are used to make electrical contact with nodes or conductive layer 112 on each semiconductor die 104 and provide electrical stimuli to contact pads 112. Semiconductor die 104 responds to the electrical stimuli, which is measured by computer test system 120 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 100 enables semiconductor die 104 that pass to be designated as known good die (KGD) for use in a semiconductor package.

Figure 2D:
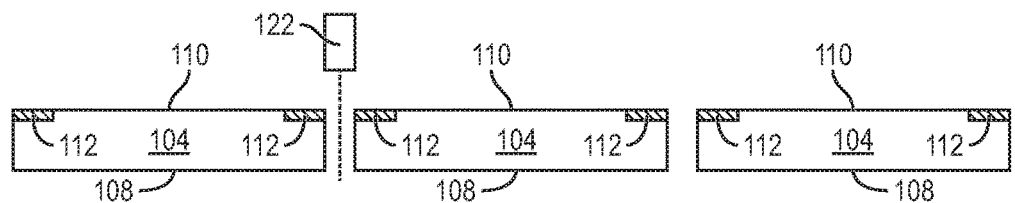

In FIG. 2d, semiconductor wafer 100 is singulated through saw street 106 into individual semiconductor die 104 using plasma etching. Plasma etching has advantages of forming precision side surfaces of semiconductor die 104, while retaining the structure and integrity of the base substrate material. Alternatively, semiconductor wafer 100 is singulated through saw street 106 using a saw blade or laser cutting tool 122 into individual semiconductor die 104. The individual semiconductor die 104 can be inspected and electrically tested for identification of KGD post singulation.

Figure 3A:
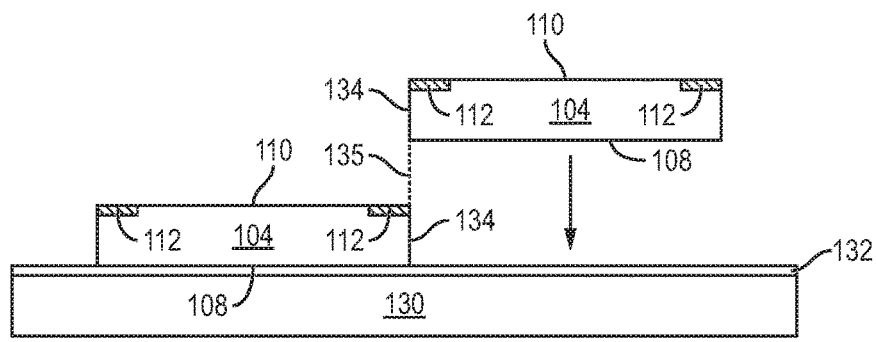
FIGS. 3a-3d illustrate a process of forming an inter-die interconnect between adjacent semiconductor die having contacting side surfaces.

FIGS. 3a-3d illustrate a process of forming an inter-die interconnect arrangement between side-by-side semiconductor die with contacting side surfaces. FIG. 3a shows a cross-sectional view of a portion of a carrier or temporary substrate 130 containing sacrificial base material such as silicon, polymer, beryllium oxide, glass, or other suitable low-cost, rigid material for structural support. Substrate 130 can also be a leadframe, ultraviolet (UV) or non-UV tape, tape mounted to a film frame, interposer, board, or stiff tape. An interface layer or double-sided tape 132 is formed over substrate 130 as a temporary adhesive bonding film, etch-stop layer, or thermal release layer.

Figure 3B:
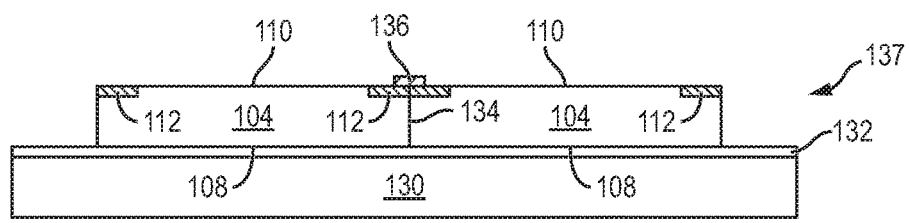

Semiconductor die 104 from FIGS. 2a-2d are mounted to substrate 130 using a pick and place operation with back surface 108 oriented toward the substrate and side surfaces 134 of base substrate material 102 of side-by-side semiconductor die 104 aligned at 135. FIG. 3b shows semiconductor die 104 mounted to substrate 130 to implement reconstituted or reconfigured wafer 137. In particular, side surface 134 of base substrate material 102 of semiconductor die 104a is in direct physical contact with side surface 134 of base substrate material 102 of semiconductor die 104b. In general, side surfaces 134 of semiconductor die 104 make contact with the side surface of the side-by-side semiconductor die 104. Alternatively, the side-by-side semiconductor die 104 have negligible separation of less than 20 micrometers (μm), or less than 5 μm.

An electrically conductive layer 136 is formed to overlap conductive layers 112 of semiconductor die 104a-104b using PVD, CVD, electrolytic plating, electroless plating process, or other suitable metal deposition process. In one embodiment, conductive layer 136 is formed across conductive layer 112 of semiconductor die 104a and conductive layer 112 of semiconductor die 104b using plasma enhanced chemical vapor deposition (PeCVD) processes. Conductive layer 136 can be one or more layers of Al, Cu, Sn, Ni, Au, Ag, Ti, TiW, or other suitable electrically conductive material. Conductive layer 136 can also be an anisotropic conductive film (ACF). Conductive layer 136 provides electrical interconnect of conductive layer 112 of semiconductor die 104a and conductive layer 112 of semiconductor die 104b, which are disposed side-by-side with side surfaces 134 in physical contact with each other. Conductive layer 112 may contain plated solder and flux material. Conductive layers 112 of semiconductor die 104a-104b are electrically connected upon reflow of the solder.

Figure 3C:
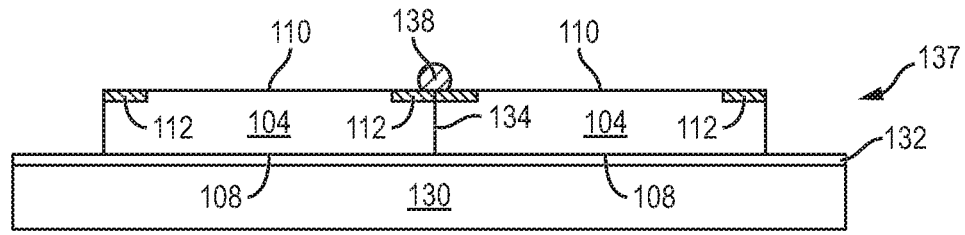

Alternatively, an electrically conductive material is deposited over the junction between conductive layer 112 of semiconductor die 104a and conductive layer 112 of semiconductor die 104b, using an evaporation, electrolytic plating, electroless plating, ball drop, or screen printing process, see FIG. 3c. The conductive material can be Al, Sn, Ni, Au, Ag, Pb, Bi, Cu, solder, and combinations thereof, with an optional flux solution. For example, the conductive material can be eutectic Sn/Pb, high-lead solder, or lead-free solder. The conductive material is bonded to conductive layers 112 of semiconductor die 104a-104b using a suitable attachment or bonding process. In one embodiment, the conductive material is reflowed by heating the material above its melting point to form interconnects 138. In some applications, interconnects 138 are reflowed a second time to improve electrical contact to conductive layers 112. Interconnects 138 can also be compression bonded or thermo-compression bonded to conductive layers 112. The conductive material can be conductive epoxy that is cured using UV light or heat. Note that a single interconnect 138 provides electrical interconnection between conductive layers 112 on semiconductor die 104a-104b.

Figure 3D:
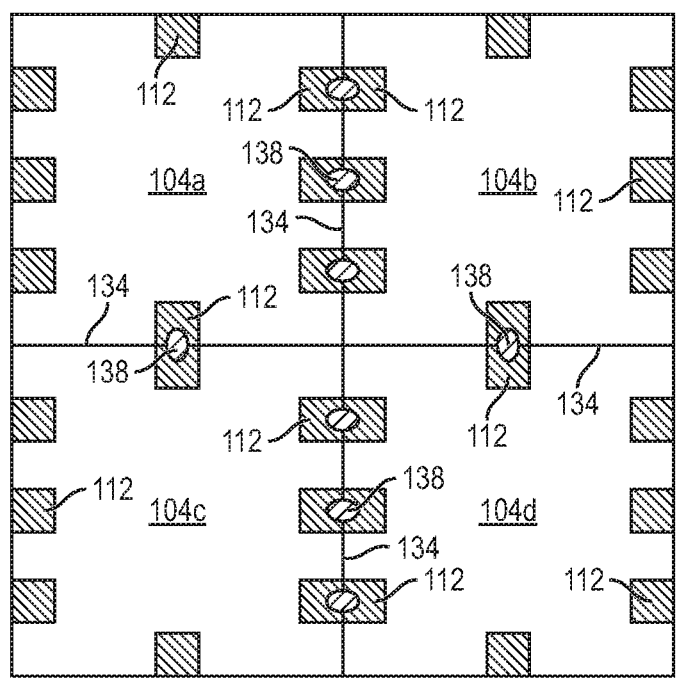

FIG. 3d illustrates a top view of semiconductor die 104a-104d with side surfaces 134 of each semiconductor die in direct physical contact with the side surface of the mating semiconductor die. Side surfaces 134 of base substrate material 102 of semiconductor die 104a contact side surfaces 134 of base substrate material 102 of semiconductor die 104b and 104c. Side surfaces 134 of base substrate material 102 of semiconductor die 104d contact side surfaces 134 of base substrate material 102 of semiconductor die 104b and 104c.

Interconnect 138 is formed across conductive layer 112 of semiconductor die 104a and conductive layer 112 of semiconductor die 104b to make electrical interconnect between the semiconductor die. Interconnect 138 is formed across conductive layer 112 of semiconductor die 104a and conductive layer 112 of semiconductor die 104c to make electrical interconnect between the semiconductor die. Interconnect 138 is formed across conductive layer 112 of semiconductor die 104b and conductive layer 112 of semiconductor die 104d to make electrical interconnect between the semiconductor die. Interconnect 138 is formed across conductive layer 112 of semiconductor die 104c and conductive layer 112 of semiconductor die 104d to make electrical interconnect between the semiconductor die. Interconnect 138 represent one type of interconnect that can be formed across conductive layers 112. The direct contact, or negligible separation, between side surfaces 134 of semiconductor die 104a-104d allow for small inter-die interconnects between conductive layers 112 of semiconductor die 104a-104d, such as conductive paste, micro bump, printed solder, wire bond, sputtered film, evaporated film, conductive epoxy, ACF, or other minimal electrical interconnect. A single interconnect 138 provides electrical interconnection between conductive layers 112 on semiconductor die 104a-104d.

Figure 1:
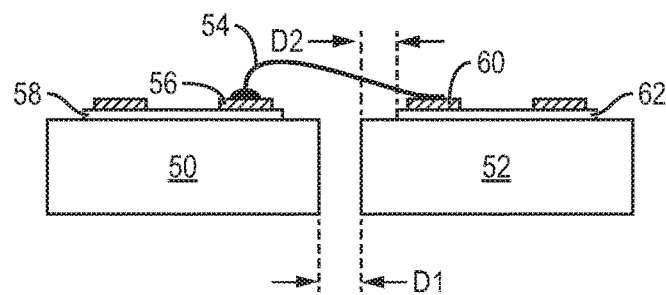
FIG. 1 illustrates a common wire bond interconnect structure between adjacent semiconductor die.

The inter-die interconnect arrangement reduces semiconductor package dimensions and cost, and can be applied to most, if not all, semiconductor materials. The rectangular package area with semiconductor die 104a-104b contacting in an interlocking configuration increases the efficiency of the footprint or total usable area of the semiconductor package. The inductance and resistance is low compared to wire bonding between separate semiconductor die as described in FIG. 1.

Figure 4A:
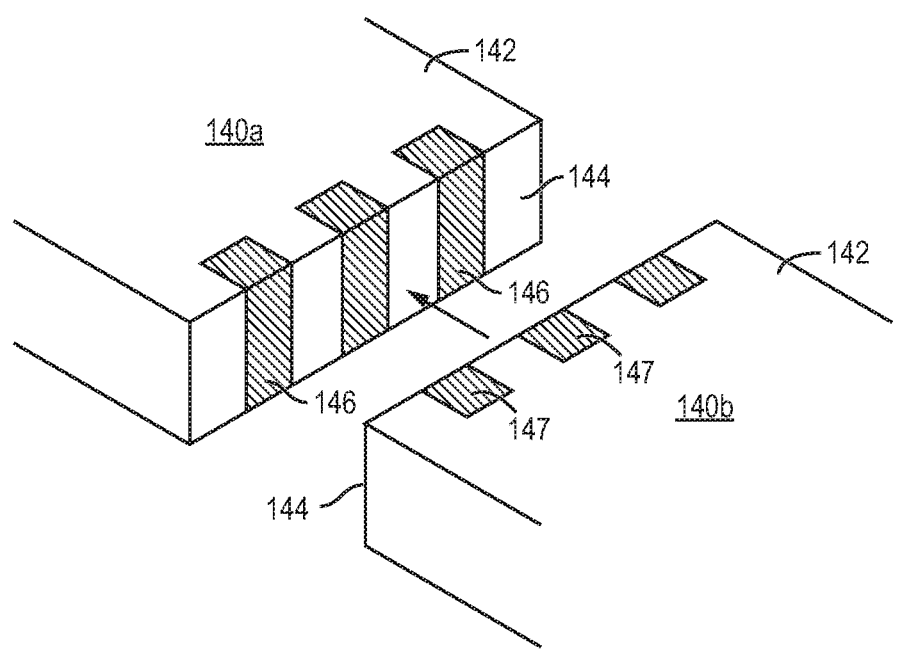
FIGS. 4a-4b illustrate forming the conductive layer vertically down the side surfaces of the semiconductor die.
Figure 4B:
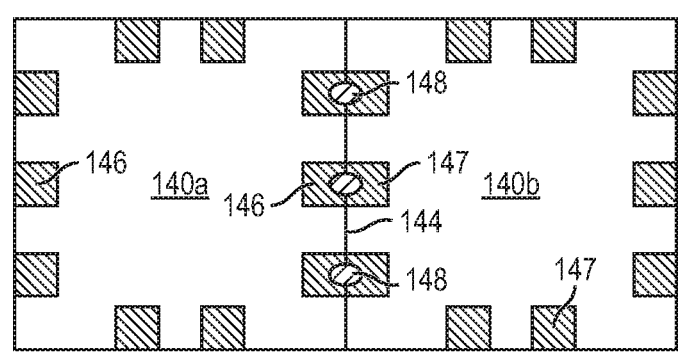

FIGS. 4a-4b illustrate another process of forming an inter-die interconnect arrangement between side-by-side semiconductor die. FIG. 4a shows an orthogonal view of semiconductor die or substrates 140a and 140b with active surface 142 and side surfaces 144, similar to semiconductor die 104 singulated from semiconductor wafer 100. An electrically conductive layer 146 is formed over active surface 142 and side surfaces 144 of semiconductor die 140a using PVD, CVD, electrolytic plating, electroless plating process, or other suitable metal deposition process. Likewise, an electrically conductive layer 147 is formed over active surface 142 and side surfaces 144 of semiconductor die 140b using PVD, CVD, electrolytic plating, electroless plating process, or other suitable metal deposition process. Conductive layers 146 and 147 can be one or more layers of Al, Cu, Sn, Ni, Au, Ag, Ti, TiW, or other suitable electrically conductive material. Conductive layers 146-147 operate as inter-die contact areas electrically connected to the circuits on active surfaces 142 on semiconductor die 140a-140b, respectively.

Semiconductor die 140a-140b are brought together using a pick and place operation. FIG. 4b shows a top view of side surface 144 of the base substrate material of semiconductor die 140a in direct physical contact with side surface 144 of the base substrate material of semiconductor die 140b. Conductive layer 146 on side surface 144 of semiconductor die 140a are aligned to make electrical contact with conductive layer 147 on side surface 144 of semiconductor die 140b for greater contact surface area. In general, side surfaces 144 of each semiconductor die 140 make contact with the side surface of another side-by-side semiconductor die 140 with conductive layer 146 making electrical connection with conductive layer 147 to provide greater contact surface area.

An electrically conductive material is deposited over the junction between conductive layer 146 of semiconductor die 140a and conductive layer 147 of semiconductor die 140b, using an evaporation, electrolytic plating, electroless plating, ball drop, or screen printing process. The conductive material can be Al, Sn, Ni, Au, Ag, Pb, Bi, Cu, solder, and combinations thereof, with an optional flux solution. For example, the conductive material can be eutectic Sn/Pb, high-lead solder, or lead-free solder. The conductive material is bonded to conductive layers 146-147 of semiconductor die 140a-140b using a suitable attachment or bonding process. In one embodiment, the conductive material is reflowed by heating the material above its melting point to form interconnects 148. In some applications, interconnects 148 are reflowed a second time to improve electrical contact to conductive layers 146-147. Interconnects 148 can also be compression bonded or thermo-compression bonded to conductive layers 146-147. The conductive material can be conductive epoxy that is cured using UV light or heat.

Interconnect 148 is formed across the junction between conductive layer 146 of semiconductor die 140a and conductive layer 147 of semiconductor die 140b to make electrical interconnect between the semiconductor die. During reflow, interconnect 148 may flow down conductive layers 146 and 147 on side surfaces 144 for a larger secure bond and to account for manufacturing tolerances. Interconnect 148 represent one type of interconnect that can be formed across conductive layers 146-147. The direct contact between side surfaces 144 of semiconductor die 140a-140d allow for small inter-die interconnects between conductive layers 146-147 of semiconductor die 140a-140d, such as conductive paste, micro bump, printed solder, wire bond, sputtered film, evaporated film, conductive epoxy, ACF, or other minimal electrical interconnect.

Figure 5A:
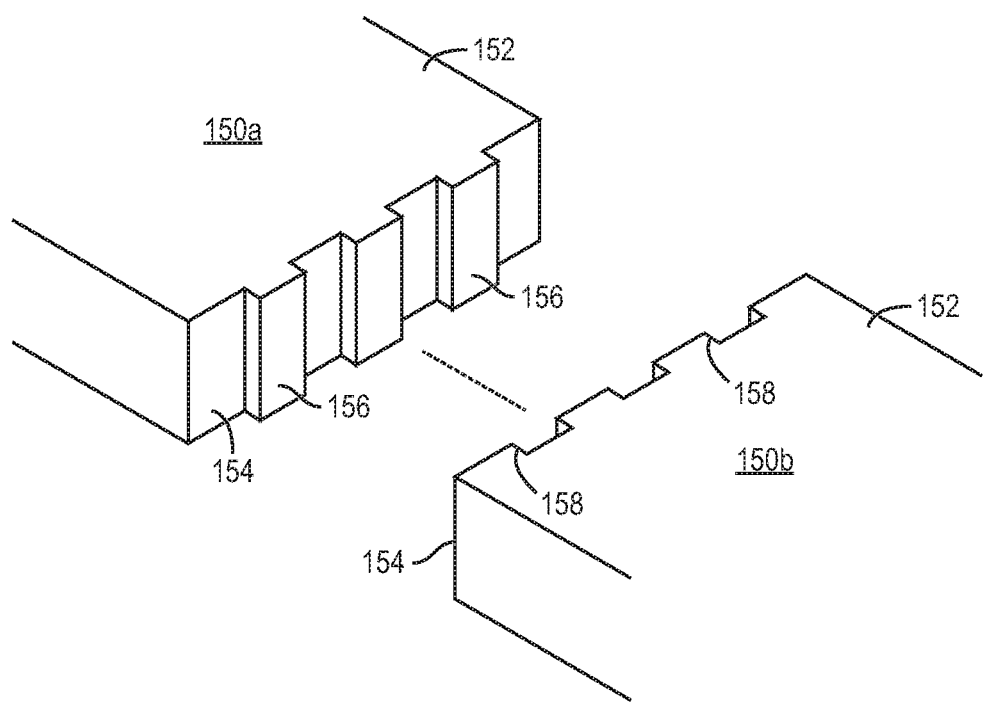
FIGS. 5a-5c illustrate forming conductive extensions and recesses on the side surfaces of the semiconductor die.
Figure 5B:
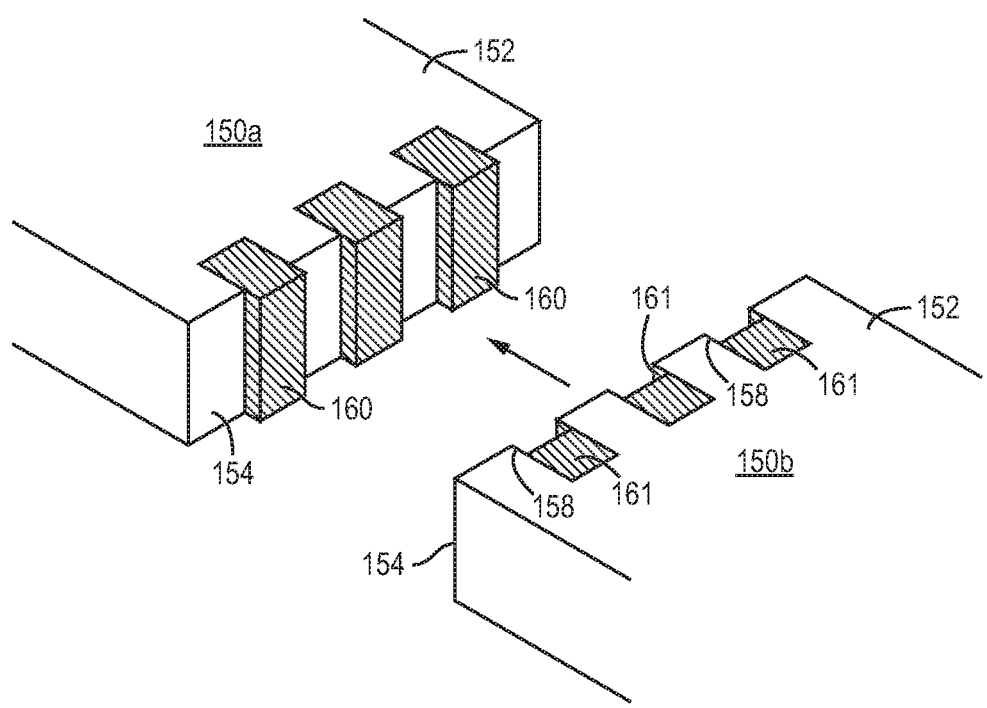
Figure 5C:
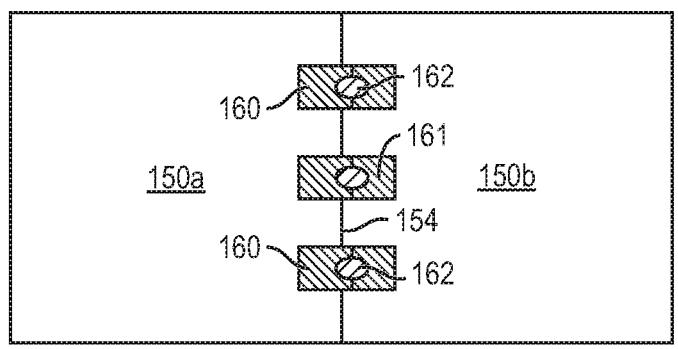

FIGS. 5a-5c illustrate another process of forming an inter-die interconnect arrangement between interlocked side-by-side semiconductor die. FIG. 5a shows an orthogonal view of semiconductor die or substrates 150a and 150b with active surface 152 and side surfaces 154, similar to semiconductor die 104 singulated from semiconductor wafer 100. Side surface 154 of semiconductor die 150a is plasma etched to form extensions 156, and side surface 154 of semiconductor die 150b is plasma etched to form recesses 158. The precision plasma etching allows extensions 156 and recesses 158 to be formed with dimensions capable of closely and securely interlocking together. Plasma etching forms precision side surfaces of semiconductor die 104 with extensions 156 and recesses 158, while retaining the structure and integrity of the base substrate material.

In FIG. 5b, an electrically conductive layer 160 is formed over active surface 152 and extensions 156 of side surfaces 154 of semiconductor die 150a using PVD, CVD, electrolytic plating, electroless plating process, or other suitable metal deposition process. Likewise, an electrically conductive layer 161 is formed over active surface 152 and recesses 158 of side surfaces 154 of semiconductor die 150b. Conductive layers 160-161 can be one or more layers of Al, Cu, Sn, Ni, Au, Ag, Ti, TiW, or other suitable electrically conductive material. Conductive layers 160-161 operate as inter-die contact areas electrically connected to the circuits on active surfaces 152 of semiconductor die 150a-150b, respectively.

Semiconductor die 150a-150b are brought together using a pick and place operation. Semiconductor die 150a-150b are positioned with extensions 156 covered with conductive layer 160 aligned with recesses 158 covered with conductive layer 161. Once extensions 156 are inserted into recesses 158, semiconductor die 150a-150b are securely interlocked. FIG. 5c shows a top view of extensions 156 covered with conductive layer 160 inserted into recesses 158 covered with conductive layer 161 and semiconductor die 150a interlocked with semiconductor die 150b. Side surface 154 of the base substrate material of semiconductor die 150a is in direct physical contact with side surface 154 of the base substrate material of semiconductor die 150b. Conductive layer 160 over extensions 156 of semiconductor die 150a makes electrical connection with conductive layer 161 on recesses 158 of semiconductor die 150b to provide greater contact surface area.

An electrically conductive material is deposited over the junction between conductive layer 160 on active surface 152 of semiconductor die 150a and conductive layer 161 on active surface 152 of semiconductor die 150b, using an evaporation, electrolytic plating, electroless plating, ball drop, or screen printing process. The conductive material can be Al, Sn, Ni, Au, Ag, Pb, Bi, Cu, solder, and combinations thereof, with an optional flux solution. For example, the conductive material can be eutectic Sn/Pb, high-lead solder, or lead-free solder. The conductive material is bonded to conductive layers 160-161 on active surfaces 152 of semiconductor die 150a-150b using a suitable attachment or bonding process. In one embodiment, the conductive material is reflowed by heating the material above its melting point to form interconnects 162. In some applications, Interconnects 162 are reflowed a second time to improve electrical contact to conductive layers 160-161. Interconnects 162 can also be compression bonded or thermo-compression bonded to conductive layers 160-161. The conductive material can be conductive epoxy that is cured using UV light or heat.

Interconnect 162 is formed across the junction between conductive layer 160 on active surface 152 of semiconductor die 150a and conductive layer 161 on active surface 152 of semiconductor die 150b to make electrical interconnect between the semiconductor die. During reflow, interconnect 162 may flow down conductive layers 160 and 161 on side surfaces 154 for a larger secure bond and to account for manufacturing tolerances. Interconnect 162 represent one type of interconnect that can be formed across conductive layers 160-161. The direct contact between extensions 156 and recesses 158 of semiconductor die 150a-150b allow for small inter-die interconnects between conductive layers 160-161 of semiconductor die 150a-150b, such as conductive paste, micro bump, printed solder, wire bond, sputtered film, evaporated film, conductive epoxy, ACF, or other minimal electrical interconnect.

Figure 6A:
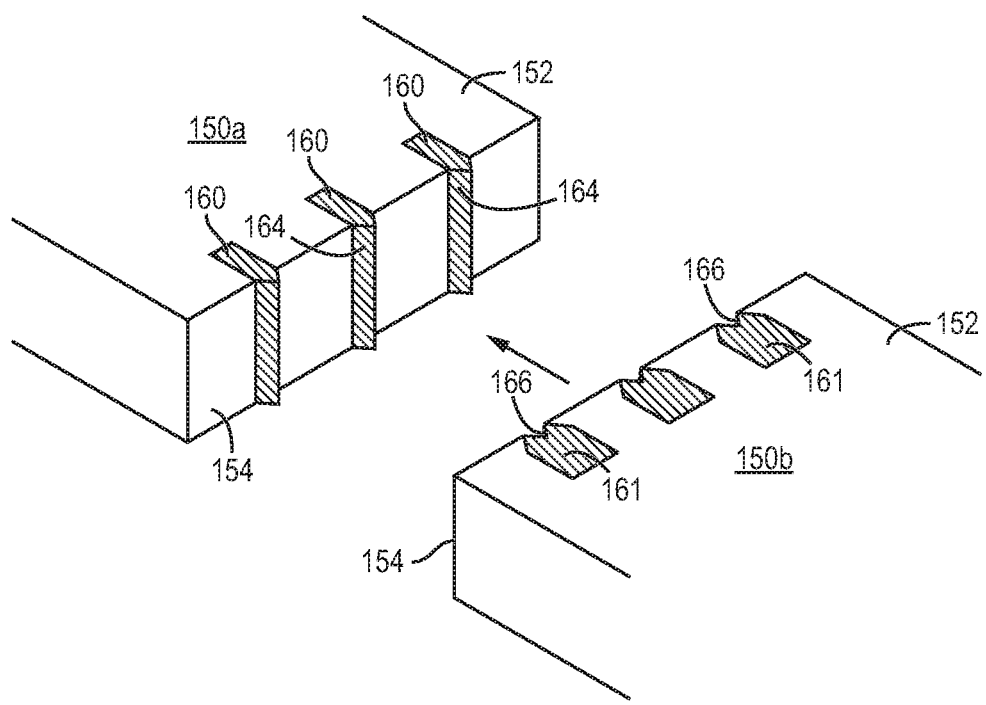
FIGS. 6a-6b illustrate forming conductive extensions and recesses with angled profiles on the side surfaces of the semiconductor die.

FIG. 6a shows an orthogonal view of another embodiment with extensions 156 having an angled profile 164 and recesses 158 having an opposite angled profile 166 for more secure interlocking. The precision plasma etching allows extensions 156 with angled profile 164 and recesses 158 with angled profile 166 to be formed with dimensions capable of closely and securely interlocking together. Plasma etching forms precision side surfaces of semiconductor die 104 with the angled-profile extensions 156 and angled-profile recesses 158, while retaining the structure and integrity of the base substrate material. Conductive layer 160 is formed over active surface 152 and the angled-profile extensions 156 of side surfaces 154 of semiconductor die 150a using PVD, CVD, electrolytic plating, electroless plating process, or other suitable metal deposition process. Likewise, an electrically conductive layer 161 is formed over active surface 152 and the angled-profile recesses 158 of side surfaces 154 of semiconductor die 150b.

Figure 6B:
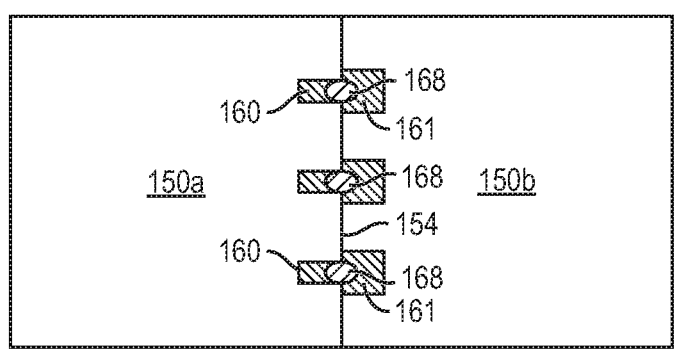

FIG. 6b is a top view of another embodiment with extensions 156 having angled profile 164 inserted into recesses 158 having opposite angled profile 166. Side surface 154 of the base substrate material of semiconductor die 150a is in direct physical contact with side surface 154 of the base substrate material of semiconductor die 150b. Conductive layer 160 over the angled-profile extensions 156 of semiconductor die 150a makes electrical connection with conductive layer 161 on the angled-profile recesses 158 of semiconductor die 150b to provide greater contact surface area. Interconnect 168 is formed across the junction between conductive layer 160 on active surface 152 of semiconductor die 150a and conductive layer 161 on active surface 152 of semiconductor die 150b to make electrical interconnect between the semiconductor die. During reflow, interconnect 168 may flow down conductive layers 160 and 161 on side surfaces 154 for a larger secure bond and to account for manufacturing tolerances. The interlocking feature with angled-profile extensions and angled-profile recesses can be formed on any side surface 154 of semiconductor die 150a-150b.

Figure 7A:
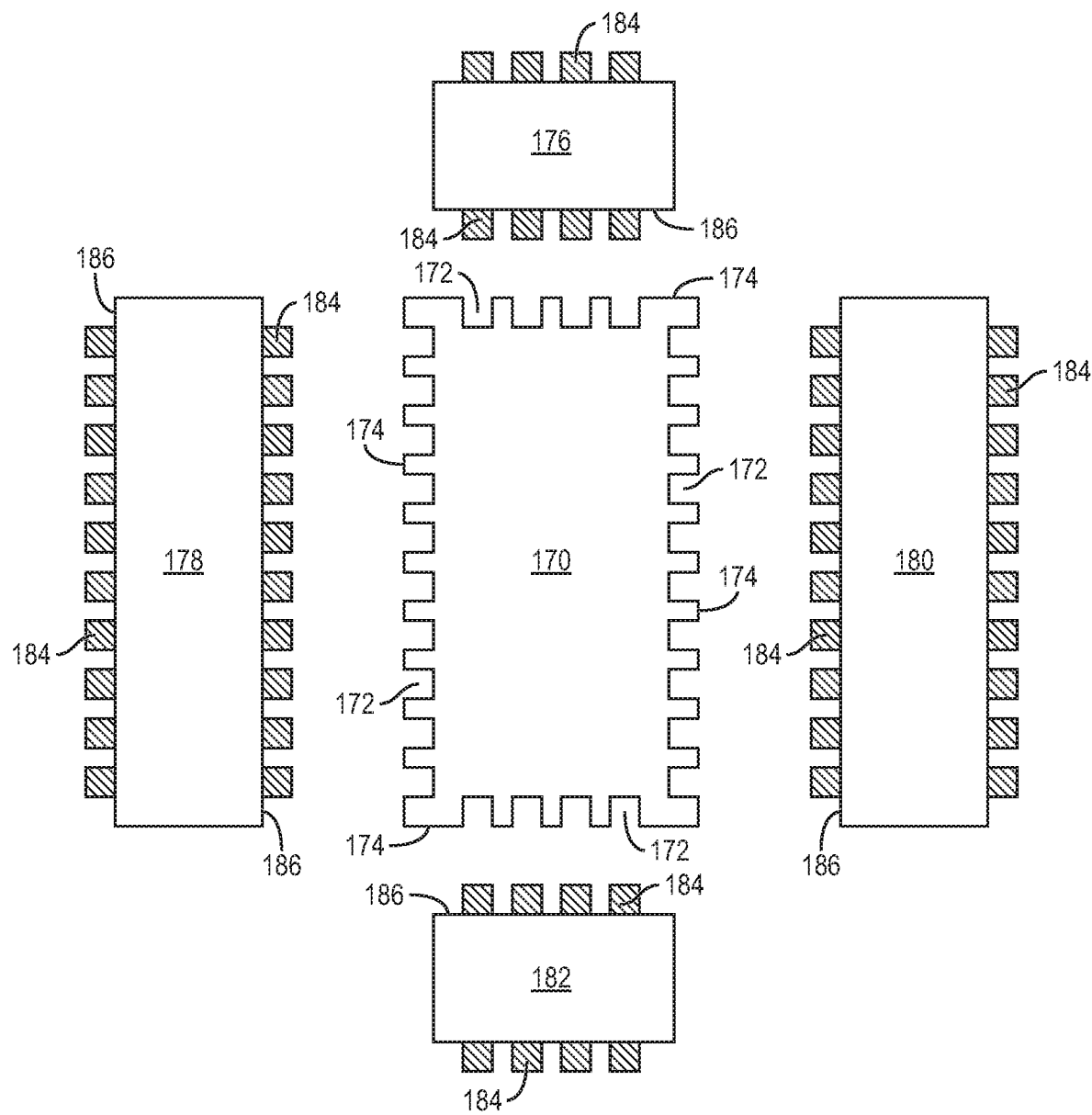
FIGS. 7a-7c illustrate an inter-die interconnect on multiple sides of semiconductor die with conductive extensions and recesses.
Figure 7B:
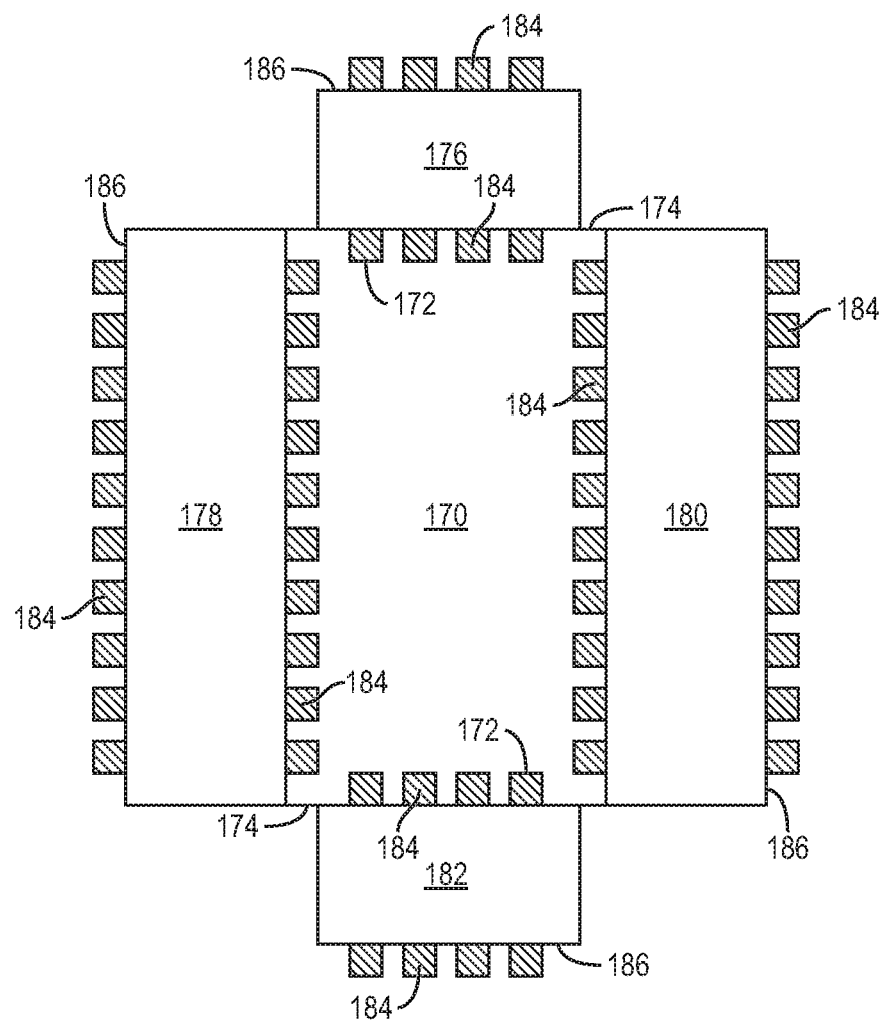
Figure 7C:
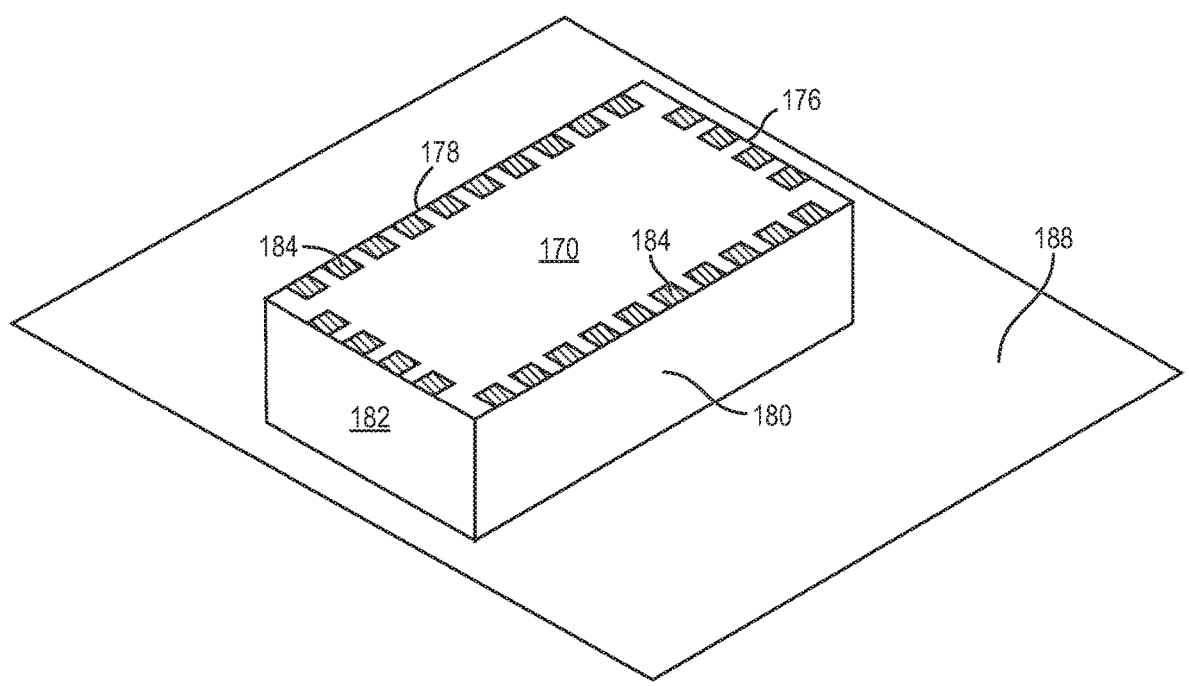

The interlocking feature can be formed on any side surface of the semiconductor die. FIG. 7a shows semiconductor die or substrate 170 with recesses 172 covered by a conductive layer formed on side surfaces 174, similar to FIG. 5b. Semiconductor die or substrates 176, 178, 180, and 182 each have extensions 184 covered by a conductive layer formed on side surfaces 186, similar to FIG. 5b. Extensions 184 of semiconductor die 176-182 insert into recesses 172 of semiconductor die 170. FIG. 7b shows semiconductor die 176-182 contacting each side of semiconductor die 170 with the contact between extensions 184 covered by the conductive layer and recesses 172 covered by the conductive layer providing inter-die electrical interconnect. FIG. 7c shows semiconductor die 170 and 176-182 in a cube configuration disposed over substrate 188. Semiconductor die 176-182 constitute the sides of the cube mounted to substrate 188, and semiconductor die 170 is the top of the cube with contact between extensions 184 covered by the conductive layer and recesses 172 covered by the conductive layer providing inter-die electrical interconnect.

Figure 8:
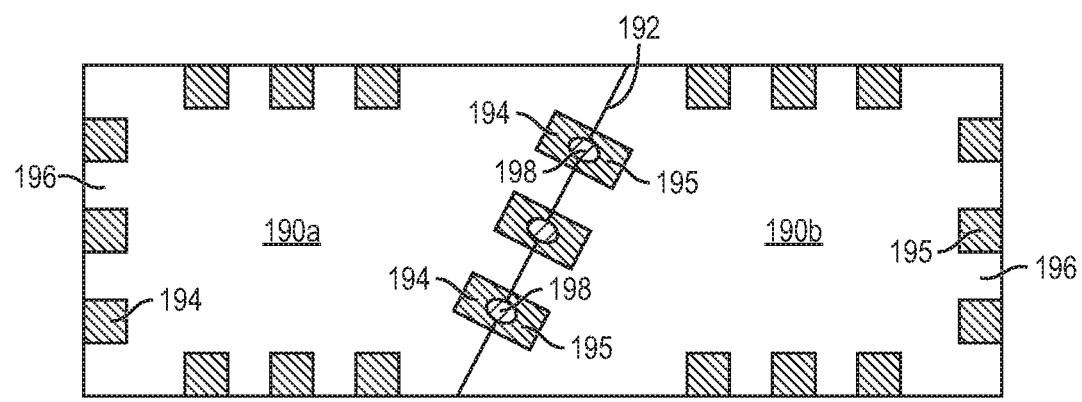
FIG. 8 illustrates an inter-die interconnect for semiconductor die having angled side surfaces.

FIG. 8 illustrates another embodiment of semiconductor die or substrates 190a-190b with angled side surfaces 192. Conductive layer 194 can be formed on active surface 196 of semiconductor die 190a, similar to FIGS. 3a-3d, and/or vertically down side surfaces 192, similar to FIG. 4a-4b. Likewise, conductive layer 195 can be formed on active surface 196 of semiconductor die 190b. Side surface 192 of the base substrate material of semiconductor die 190a is in direct physical contact with, or negligible separation from, side surface 192 of the base substrate material of semiconductor die 190b. Conductive layer 194 of semiconductor die 190a makes contact with, or negligible separation from, conductive layer 195 of semiconductor die 190b. Interconnect 198 is formed across the junction between conductive layer 194 on active surface 196 of semiconductor die 190a and conductive layer 195 on active surface 196 of semiconductor die 190b to make electrical interconnect between the semiconductor die. During reflow, interconnect 198 may flow down conductive layers 198 on side surfaces 192 for a larger secure bond and to account for manufacturing tolerances.

Figure 9:
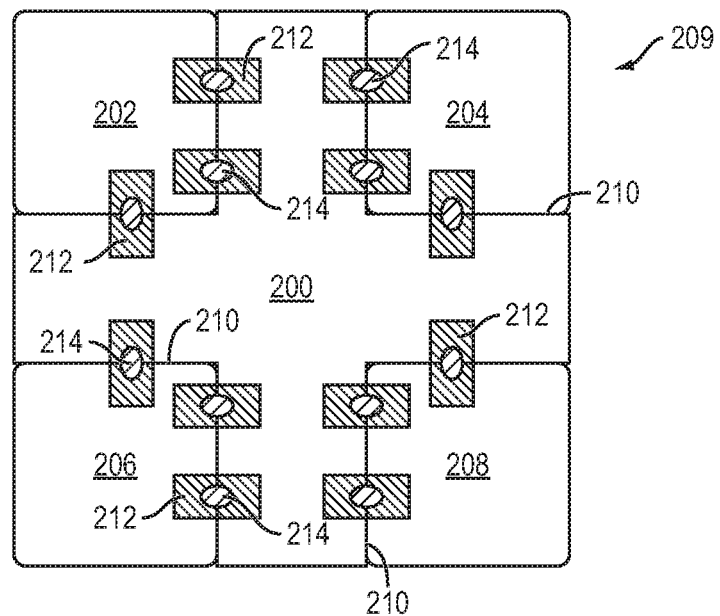
FIG. 9 illustrates an inter-die interconnect for multiple semiconductor die in a rectangular package.

FIG. 9 illustrates another embodiment of an inter-die interconnect arrangement with semiconductor die or substrate 200 having a cross or "+" form factor. Semiconductor die or substrates 202, 204, 206, and 208 are disposed within the L-shaped notches of the "+" form factor to make a rectangular semiconductor package 209. Conductive layer 212 can be formed on the active surfaces of semiconductor die 200-208, similar to FIGS. 3a-3d, and/or vertically down side surfaces 210, similar to FIGS. 4a-4b. Side surface 210 of the base substrate material of semiconductor die 200 is in direct physical contact with, or negligible separation from, side surface 210 of the base substrate material of semiconductor die 202-208. Conductive layer 212 of semiconductor die 200 makes contact with, or negligible separation from, conductive layer 212 of semiconductor die 202-208. Interconnects 214 are formed across the junction between conductive layer 212 on the active surface of semiconductor die 200 and conductive layer 212 on the active surface of semiconductor die 202-208 to make electrical interconnect between the semiconductor die. During reflow, interconnect 214 may flow down conductive layers 212 on side surfaces 210 for a larger secure bond and to account for manufacturing tolerances.

Figure 10:
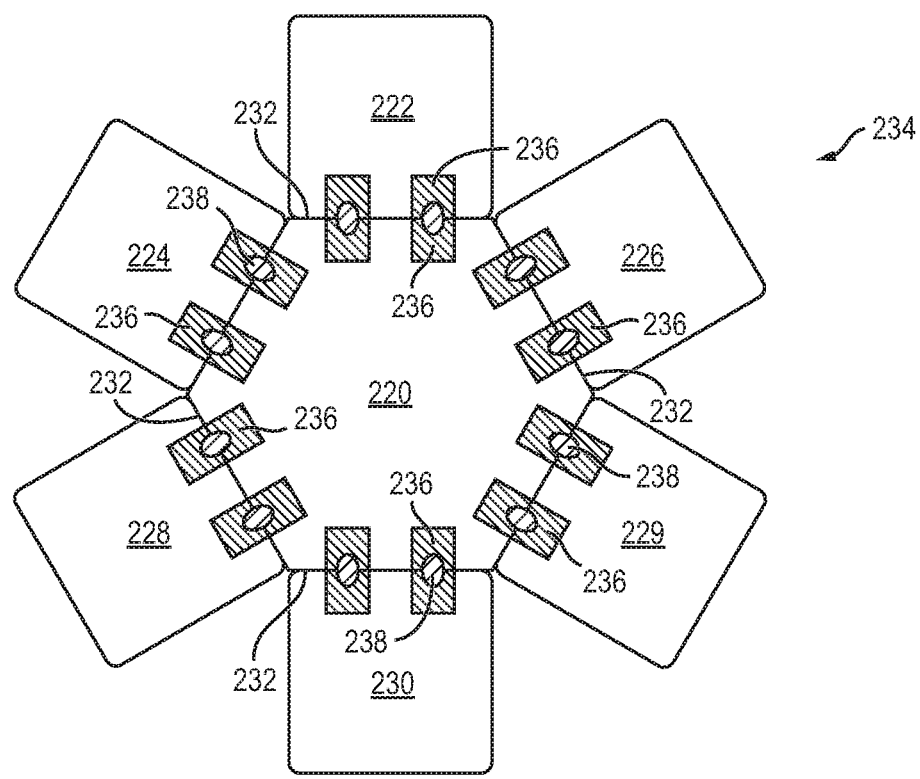
FIG. 10 illustrates an inter-die interconnect for multiple semiconductor die in a hexagonal package.

FIG. 10 illustrates another embodiment of an inter-die interconnect arrangement with semiconductor die or substrate 220 having a polygon form factor, e.g. hexagonal die. Semiconductor die or substrates 222, 224, 226, 228, 229, and 230 are disposed on each side surface 232 to make a star-shaped semiconductor package 234. Conductive layer 236 can be formed on the active surfaces of semiconductor die 222-230, similar to FIGS. 3a-3d, and/or vertically down side surfaces 232, similar to FIGS. 4a-4b. Side surface 232 of the base substrate material of semiconductor die 220 is in direct physical contact with, or negligible separation from, side surface 232 of the base substrate material of semiconductor die 222-230. Conductive layer 236 of semiconductor die 220 makes contact with, or negligible separation from, conductive layer 236 of semiconductor die 222-230. Interconnects 238 are formed across the junction between conductive layer 236 on the active surface of semiconductor die 220 and conductive layer 236 on the active surface of semiconductor die 222-230 to make electrical interconnect between the semiconductor die. During reflow, interconnect 238 may flow down conductive layers 236 on side surfaces 232 for a larger secure bond and to account for manufacturing tolerances. The polygon form factor of semiconductor die 220 increases the efficiency of the footprint or total usable area of the semiconductor package.

Figure 11:
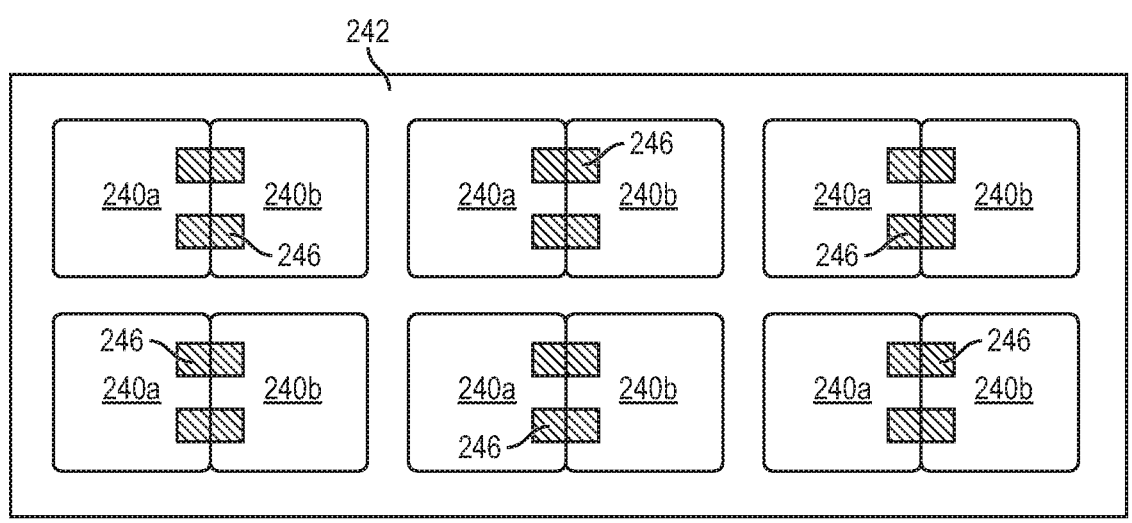
FIG. 11 illustrates an inter-die interconnect for pairs of semiconductor die on a substrate.

FIG. 11 illustrates another embodiment of an inter-die interconnect arrangement with pairings of semiconductor die or substrates 240a-240b disposed over substrate or leadframe 242. Side surface 244 of the base substrate material of semiconductor die 240a is in direct physical contact with, or negligible separation from, side surface 244 of the base substrate material of semiconductor die 240b. Conductive layer 246 can be formed on the active surfaces of semiconductor die 240a-240b, similar to FIGS. 3a-3c, and/or vertically down side surfaces 244, similar to FIGS.

4a-4b, using an electro-plating process. Conductive layer 246 spans semiconductor die 240a-240b to make electrical interconnect between the semiconductor die.

The inter-die interconnect arrangements, as described above, reduce semiconductor package dimensions and cost, and can be applied to most, if not all, semiconductor materials. The inductance and resistance is low compared to wire bonding between separate semiconductor die.

In the case of 3D semiconductor packages, a modular unit or building-block approach can simplify structural configuration and electrical interconnect in packaging multiple semiconductor die.

Figure 12A:
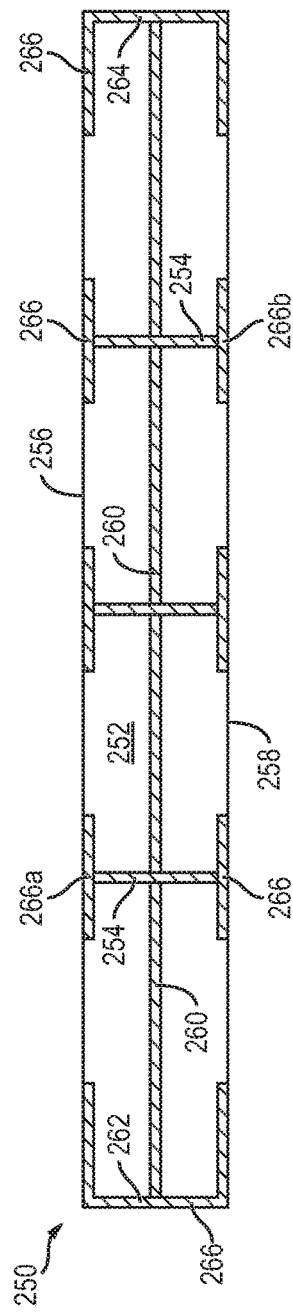
FIGS. 12a-12c illustrate interconnect interposers and semiconductor die as modular units for a 3D semiconductor package.

FIG. 12a illustrates a cross-sectional view of interconnect interposer 250 including a core insulating material 252 containing one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO)), or other material having similar insulating and structural properties. Conductive vias 254 are formed vertically through core insulating material 252 between major surface 256 and major surface 258 of interconnect interposer 250. Conductive layer 260 is formed laterally through core insulating material 252 between side surface 262 and side surface 264 of interconnect interposer 250. An electrically conductive layer 266 is formed over major surface 256 and major surface 258 of interconnect interposer 250 using PVD, CVD, electrolytic plating, electroless plating process, or other suitable metal deposition process. Conductive layer 266 is also formed over side surface 262 and side surface 264 of interconnect interposer 250. Conductive vias 254 and conductive layers 260 and 266 can be one or more layers of Al, Cu, Sn, Ni, Au, Ag, Ti, TiW, or other suitable electrically conductive material. Conductive vias 254 and conductive layers 260 and 266 provide vertical and lateral routing through interconnect interposer 250 according to the electrical function of the semiconductor package. Any portion of conductive layer 266 on any surface of interconnect interposer 250 can connect through conductive vias 254 and conductive layer 260 to any other portion of conductive layer 266 on any other surface of the interconnect interposer to achieve the desired electrical routing. For example, conductive layer 266a can be connected through conductive vias 254 and conductive layer 260 to conductive layer 266b. The layout of conductive vias 254 and conductive layers 260 and 266 are dependent on the interconnect requirements of the package design, i.e. portions of conductive vias 254 and conductive layers 260 and 266 shown in FIG. 12a may be used, modified, or omitted according to the interconnect requirements.

Figure 12B:
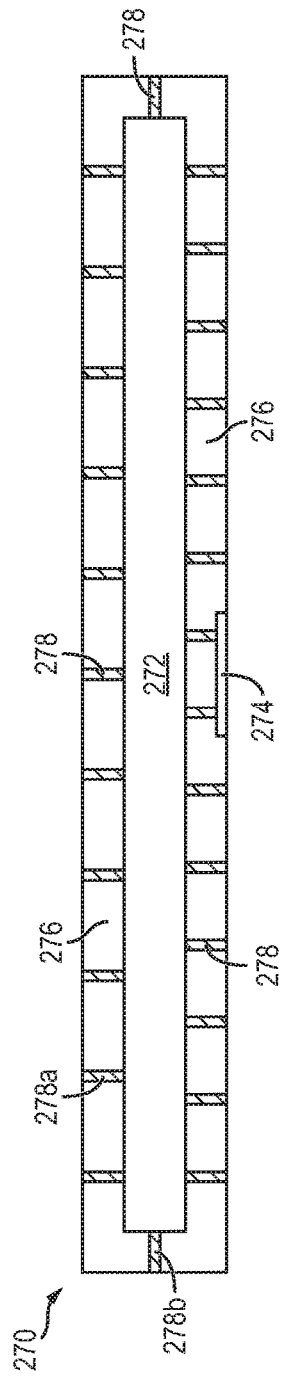

FIG. 12b illustrates a cross-sectional view of interconnect interposer 270 including switching matrix 272 containing a plurality of fusible links. Alternatively, switching matrix 272 includes programmable switching circuits selected by a controller and memory circuit 274. An insulating material 276 is formed around switching matrix 272. Insulating material 276 contains one or more layers of SiO2, Si3N4, SiON, Ta2O5, Al2O3, HfO2, BCB, PI, polybenzoxazoles PBO, or other material having similar insulating and structural properties. Conductive vias 278 are formed through insulating material 276 between each surface of interconnect interposer 270 and switching matrix 272. Conductive vias 278 can be Al, Cu, Sn, Ni, Au, Ag, Ti, TiW, or other suitable electrically conductive material. Conductive vias 278 and switching matrix 272 provide vertical and lateral routing through interconnect interposer 270 according to the electrical function of the semiconductor package. Any conductive via 278 on any surface of interconnect interposer 270 can connect through switching matrix 272 to any other conductive via on any other surface of the interconnect interposer to achieve the desired electrical routing. For example, conductive via 278a can be connected through switching matrix 272 to conductive via 278b.

Figure 12C:
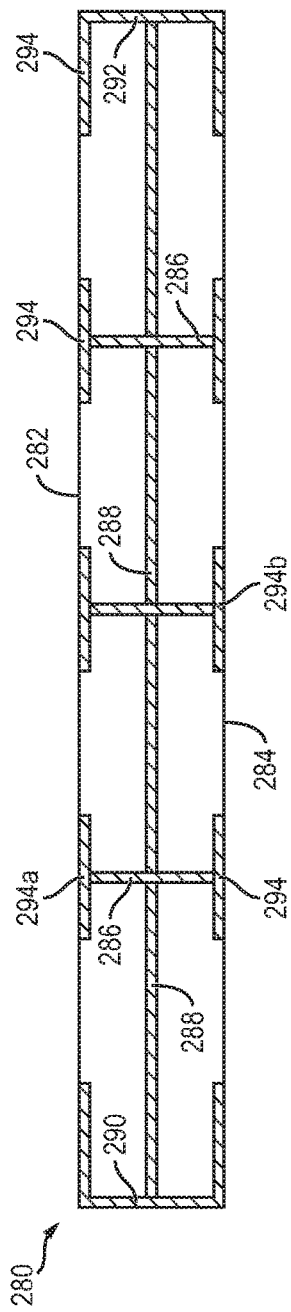

FIG. 12c illustrates a cross-sectional view of semiconductor die 280 originating from a semiconductor wafer like 100 and including active surface 282 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 282 to implement analog circuits or digital circuits, such as DSP, microcontrollers, ASIC, standard logic, amplifiers, clock management, memory, interface circuits, and other signal processing circuit. Semiconductor die 280 may also contain IPDs, such as inductors, capacitors, and resistors, for RF signal processing. Active surface 282 may contain an image sensor area implemented as semiconductor CCD and active pixel sensors in CMOS or NMOS technologies. Alternatively, semiconductor die 280 can be an optical lens, detector, VCSEL, waveguide, stacked die, EM filter, or multi-chip module. Surface 284 of semiconductor die 280 can be an active surface, as described for surface 282, or a non-active surface.

Conductive vias 286 are formed through semiconductor die 280 between surface 282 and surface 284. Conductive layer 288 is formed through semiconductor die 280 between side surface 290 and side surface 292. An electrically conductive layer 294 is formed over surface 282 and surface 284 of semiconductor die 280 using PVD, CVD, electrolytic plating, electroless plating process, or other suitable metal deposition process. Conductive layer 294 is also formed over side surface 290 and side surface 292 of semiconductor die 280. Conductive vias 286 and conductive layers 288 and 294 can be one or more layers of Al, Cu, Sn, Ni, Au, Ag, Ti, TiW, or other suitable electrically conductive material. Conductive vias 286 and conductive layers 288 and 294 provide vertical and lateral routing through semiconductor die 280 according to the electrical function of the semiconductor package. Any portion of conductive layer 294 on any surface of semiconductor die 280 can connect through conductive vias 286 and conductive layer 288 to any other portion of conductive layer 294 on any other surface of the semiconductor die to achieve the desired electrical routing. For example, conductive layer 294a can be connected through conductive vias 286 and conductive layer 288 to conductive layer 294b. The layout of conductive vias 286 and conductive layers 288 and 294 are dependent on the interconnect requirements of the package design, i.e. portions of conductive vias 286 and conductive layers 288 and 294 shown in FIG. 12c may be used, modified, or omitted according to the interconnect requirements.

FIGS. 13a-13d illustrate a standardized, modular units package integration scheme to simplify electrical interconnect and structural configuration for many different semiconductor die. 3D semiconductor package 300 includes vertical components 302 and horizontal components 304. Each vertical component 302 can be interconnect interposer 250, interconnect interposer 270, or semiconductor die 280. Each horizontal component 304 can be interconnect interposer 250, interconnect interposer 270, or semiconductor die 280. Interconnect interposer 250 represents a standardized fixed electrical routing scheme. There could be a variety of standardized fixed electrical routing interconnect interposers 250 in the design library from which to choose. Alternatively, a design specific interconnect interposer 250 can be made. Interconnect interposer 270 represents a standardized programmable electrical routing scheme. Semiconductor die 280 can provide any electrical function and, in combination with interconnect interposers 250 and 270, can achieve any 3D package configuration in a time efficient and cost effective manner as vertical components 302 and horizontal components 304 are connected together as modular units or building-blocks in a standardized package integration scheme.

Figure 13A:
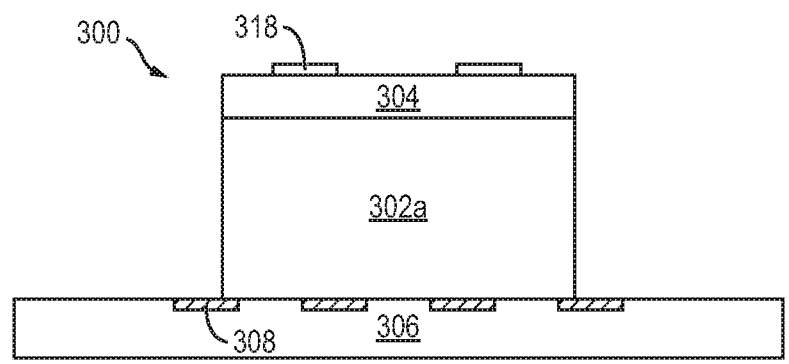
FIGS. 13a-13d illustrate a 3D semiconductor package with modular vertical components and horizontal components.
Figure 13B:
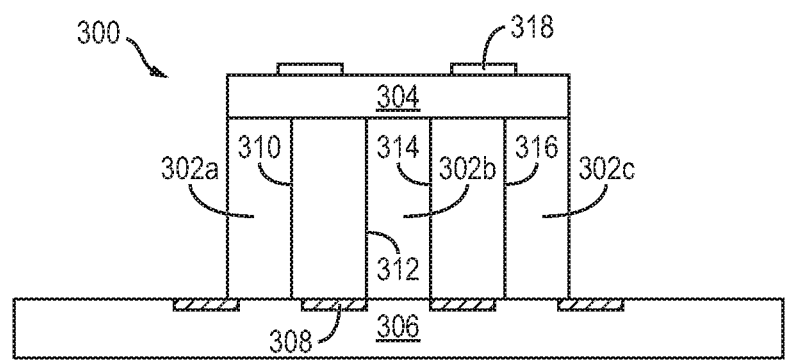
Figure 13C:
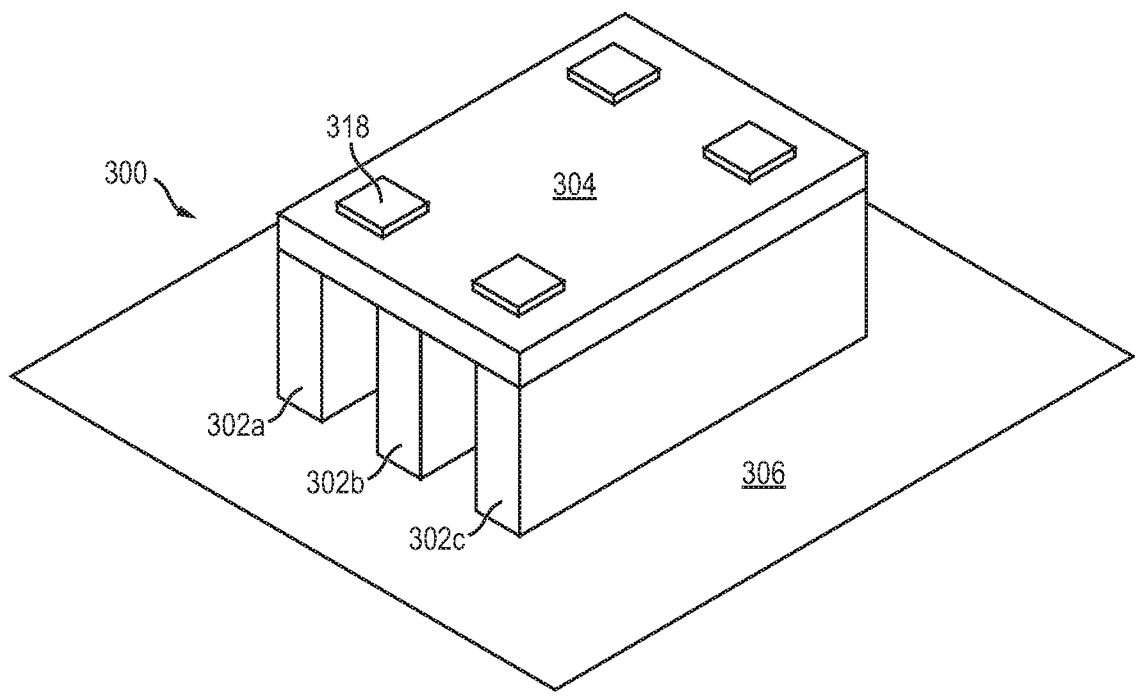
Figure 13D:
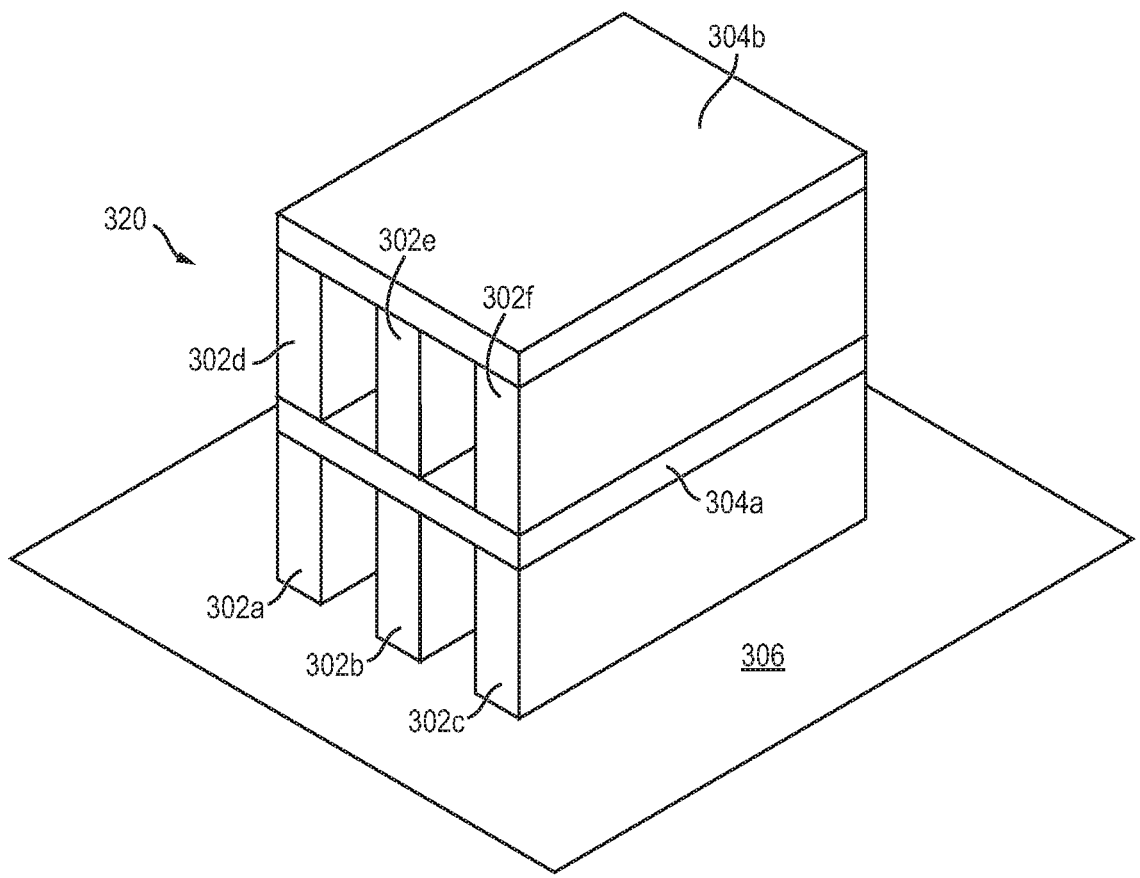

FIG. 13a shows a first side view of 3D semiconductor package 300 mounted to substrate or PCB 306 containing conductive layers 308 for electrical interconnect. FIG. 13b is a second side view taken at a 90° rotation from FIG. 13a. FIG. 13c is an orthogonal view of 3D semiconductor package 300. In one embodiment, vertical component 302a is a first semiconductor die 280 implementing a memory device, vertical component 302b is a second semiconductor die 280 implementing a controller, and vertical component 302c is a third semiconductor die 280 implementing an interface circuit. Vertical components 302a-302c are mechanically connected to substrate 306 and electrically connected to conductive layer 308. The first-third semiconductor die 280 may have the same or different electrical function, depending on the semiconductor package specifications. The first-third semiconductor die 280 may have complementary operation, e.g. memory and controller, or signal processing and interface circuits.

In an open configuration, major surface 310 of vertical component 302a is separated from major surface 312 of vertical component 302b, and major surface 314 of vertical component 302b is separated from major surface 316 of vertical component 302c. The open configuration is suited to achieve air flow over major surfaces 310-316 for heat dissipation in high power applications. In a closed or cube configuration, major surface 310 of vertical component 302a contacts major surface 312 of vertical component 302b, and major surface 314 of vertical component 302b contacts major surface 316 of vertical component 302c. The cube configuration is suited to space efficiency and maximizing circuit function density.

In the present embodiment, horizontal component 304 is an interconnect interposer 250 or 270. Horizontal component 304 is mechanically and electrically connected to vertical components 302a-302c using bumps, wire bonds, conductive epoxy, or interlocking structure, as described in FIGS. 3b-3d, 4a-4b, 5a-5c, 6a-6b, and 7a-7c. Horizontal component 304 provides electrical interconnect between vertical components 302a-302c. Discrete semiconductor devices 318, such as passive devices, diodes, and power transistors, are mounted to horizontal component 304.

In other embodiments of FIGS. 13a-13c, vertical component 302a-302c each can be interconnect interposer 250, interconnect interposer 270, or semiconductor die 280. Horizontal component 304 can be interconnect interposer 250, interconnect interposer 270, or semiconductor die 280. In the present modular units functionality and interconnect scheme, a 3D semiconductor package can be quickly implemented by selecting the appropriate vertical components 302 and horizontal components 304 for the semiconductor package specification. The vertical components 302 and horizontal components 304 are mechanically and electrically connected together to integrate the individual semiconductor die functionality. Overall package configuration can remain relatively constant or repetitive, while functionality and interconnect can be quickly changed out to meet the package requirements. For example, if the semiconductor package specification requires a different functionality or alternate design, say more memory in the first semiconductor die 280, then vertical component 302a in FIG. 13c is replaced with a fourth semiconductor die 280 having the desired function. Alternatively, the semiconductor package configuration can be quickly changed with different combinations of vertical components 302 and horizontal components 304. For example, vertical components 302d-302f can be mounted over horizontal component 304a, as shown for 3D semiconductor package 320 in FIG. 13d, and horizontal component 304b interconnects vertical components 302d-302f. Given any semiconductor package specification, the various combinations of vertical components 302 and horizontal components 304 implemented according to the standardized, modular units scheme can achieve both functionality and interconnect for any 3D package configuration in a time efficient and cost effective manner.

Figure 14A:
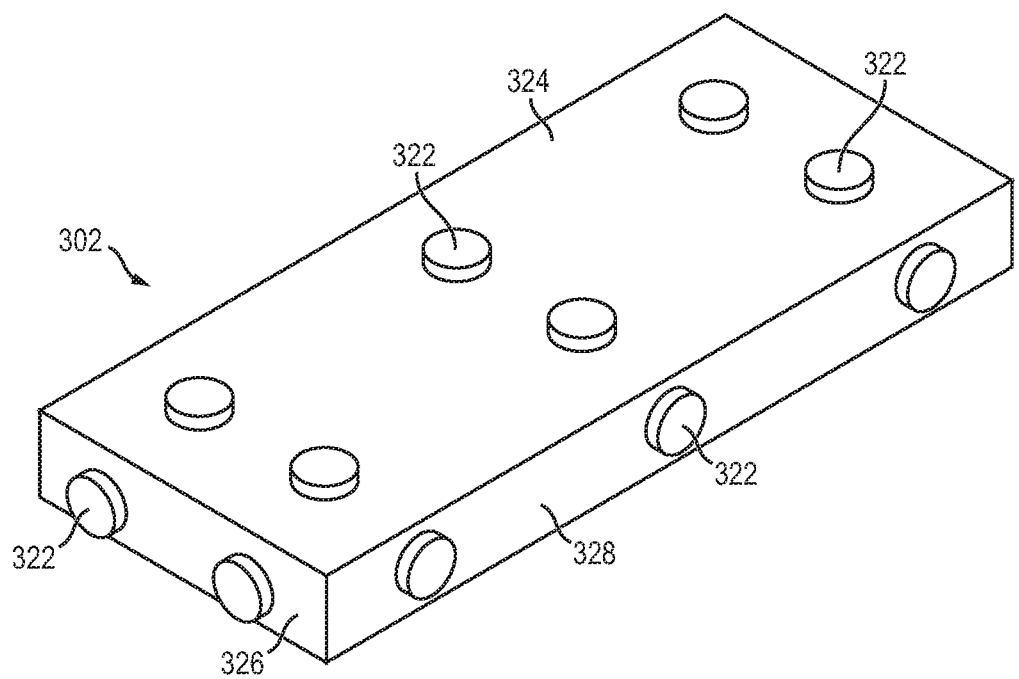
FIGS. 14a-14b illustrate the vertical component with interlocking protrusions and recesses.
Figure 14B:
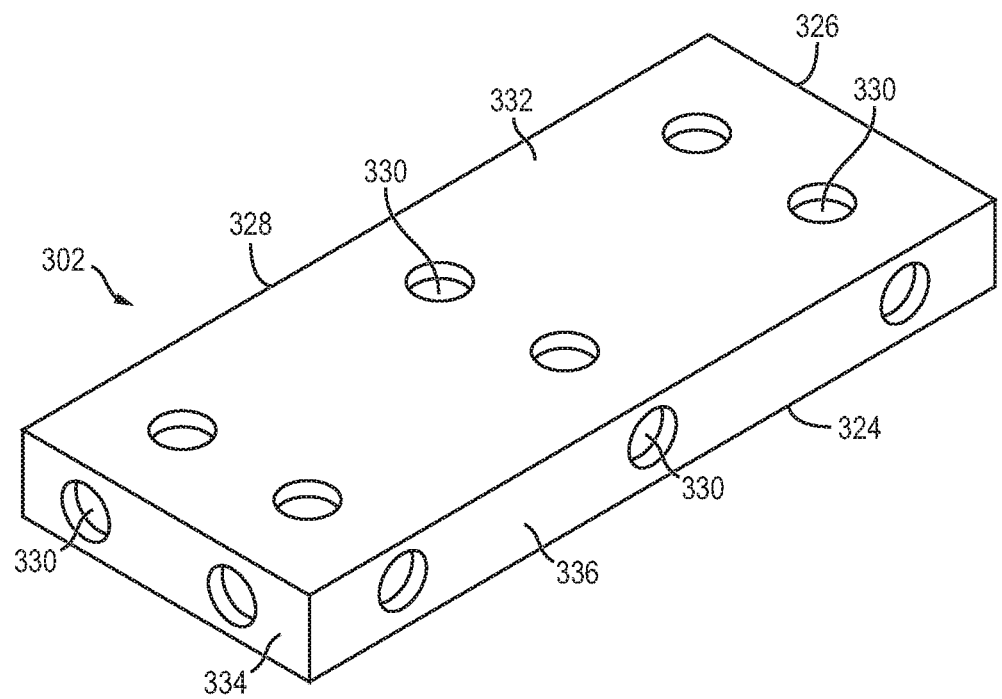

FIGS. 14a-14b illustrate a mechanical and electrical interlocking arrangement for vertical component 302. A plurality of protrusions 322 is formed on major surface 324 of vertical component 302. Protrusions 322 are also formed on side surfaces 326 and 328. Protrusions 322 can be round, oval, rectangular, or other geometric shape. A plurality of recesses 330 is formed on major surface 332 of vertical component 302, opposite major surface 324. Recesses 330 are also formed on side surfaces 334 and 336, opposite side surfaces 326 and 328, respectively. Recesses 330 have the same shape as protrusions 322 to provide a mating receptacle. Protrusions 322 and recesses 330 are etched from the base material of vertical component 302 to the desired shape. Horizontal component 304 has similar protrusions 322 and recesses 330 as vertical component 302.

Figure 15A:
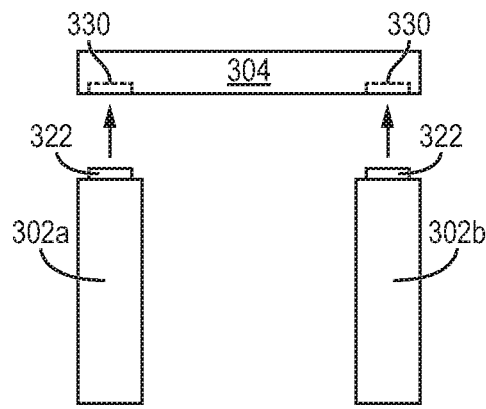
FIGS. 15a-15f illustrate the vertical component and the horizontal component interlocked with the protrusions and recesses.
Figure 15B:
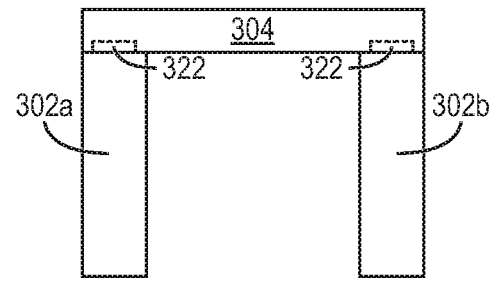
Figure 15C:
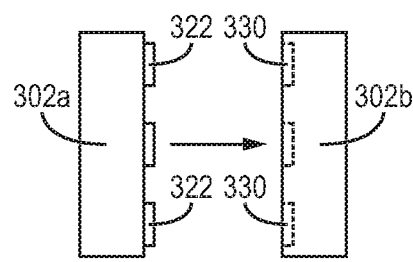
Figure 15D:
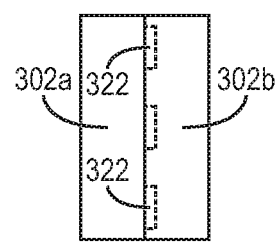
Figure 15E:
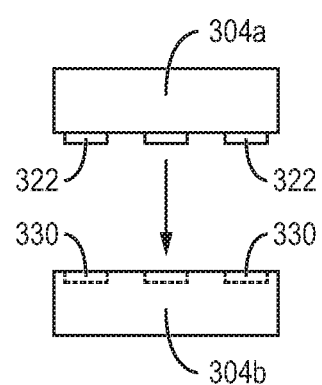
Figure 15F:
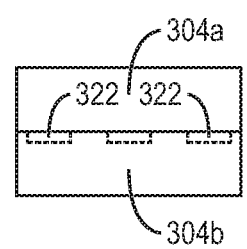

FIGS. 15a-15f illustrate keyed interlocking between vertical component 302 and horizontal component 304. In FIG. 15a, horizontal component 304 is disposed over vertical components 302a-302b with protrusions 322 of the vertical components aligned with recesses 330 of the horizontal component. In FIG. 15b, horizontal component 304 is brought into contact with vertical components 302a-302b with protrusions 322 inserted into recesses 330 to interlock the vertical components and horizontal component by the keyed arrangement of the shapes of the protrusions and recesses. In FIG. 15c, vertical component 302a is disposed alongside vertical component 302b with protrusions 322 of vertical component 302a aligned with recesses 330 of vertical component 302b. In FIG. 15d, vertical component 302a is brought into contact with vertical component 302b with protrusions 322 inserted into recesses 330 to interlock the vertical components by the keyed arrangement of the shapes of the protrusions and recesses. In FIG. 15e, horizontal component 304a is disposed over horizontal component 304b with protrusions 322 of horizontal component 304a aligned with recesses 330 of horizontal component 304b. In FIG. 15f, horizontal component 304a is brought into contact with horizontal component 304b with protrusions 322 inserted into recesses 330 to interlock the horizontal components by the keyed arrangement of the shapes of the protrusions and recesses. Vertical components 302 and horizontal components 304 can be mechanically and electrically connected using bumps, wire bonds, conductive epoxy, or interlocking structure, as described in FIGS. 3b-3d, 4a-4b, 5a-5c, 6a-6b, and 7a-7c.

Figure 16A:
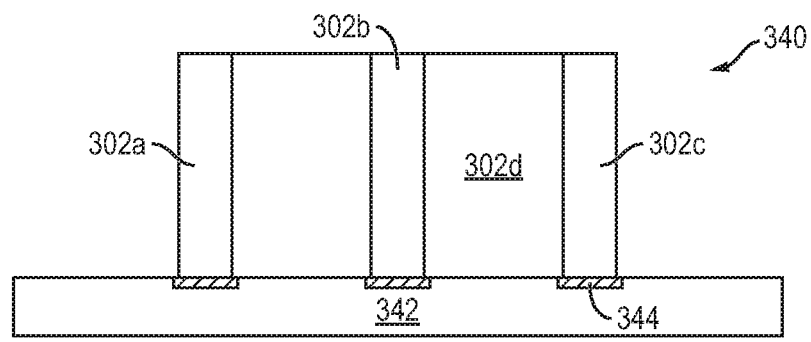
FIGS. 16a-16c illustrate another 3D semiconductor package with modular vertical components and horizontal components oriented in multiple directions.
Figure 16B:
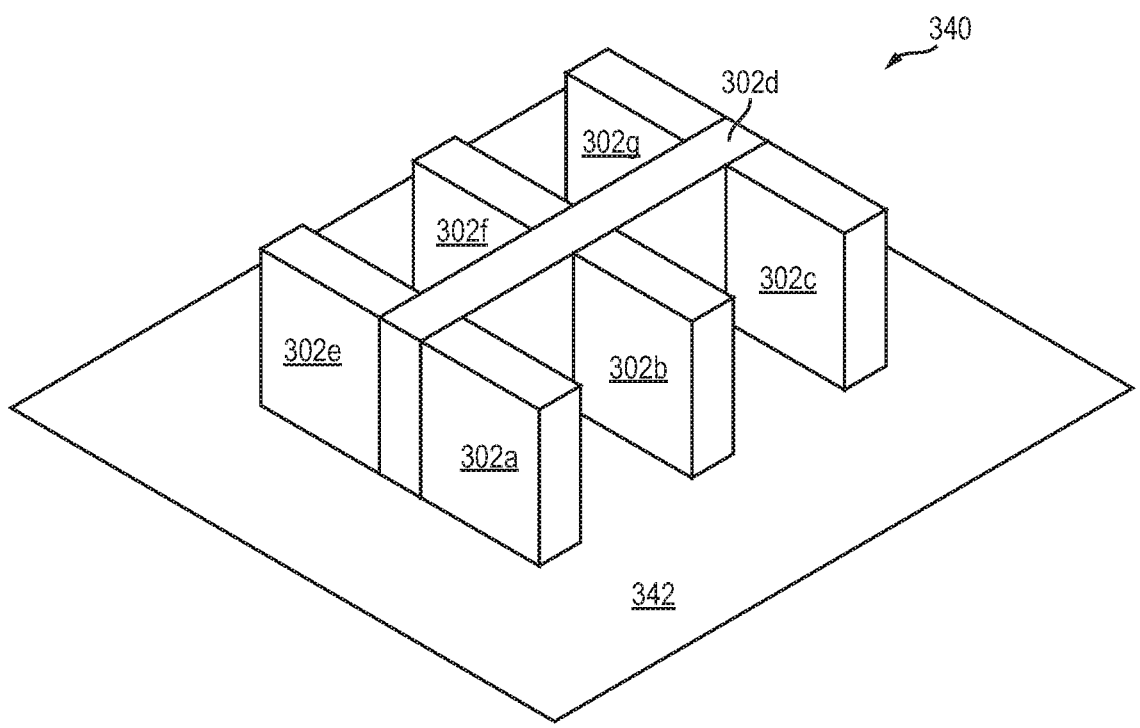

FIG. 16a shows a side view of another embodiment of 3D semiconductor package 340 mounted to substrate or PCB 342 containing conductive layers 344 for electrical interconnect. FIG. 16b is an orthogonal view of 3D semiconductor package 340 mounted to substrate 342. In one embodiment, vertical component 302a is a first semiconductor die 280 implementing a first electrical function (RF amplifier), vertical component 302b is a second semiconductor die 280 implementing a second electrical function (low pass filter), vertical component 302c is a third semiconductor die 280 implementing a third electrical function (balun), and vertical component 302d is an interconnect interposer 250 or 270. Vertical component 302e is a fourth semiconductor die 280 implementing a fourth electrical function (mixer), vertical component 302f is a fifth semiconductor die 280 implementing a fifth electrical function (modulator), and vertical component 302g is a sixth semiconductor die 280 implementing a sixth electrical function (PLL). Vertical components 302a-302g are mechanically connected to substrate 342 and electrically connected to conductive layer 344. Vertical components 302a-302c are mechanically and electrically connected to vertical component 302d using bumps, wire bonds, conductive epoxy, or interlocking structure, as described in FIGS. 3b-3d, 4a-4b, 5a-5c, 6a-6b, 7a-7c, and 15a-15f. Likewise, vertical components 302e-302g are mechanically and electrically connected to vertical component 302d. Accordingly, vertical components 302a-302c and vertical components 302e-302g are oriented to extend in opposing directions from vertical component 302d. The first-sixth semiconductor die 280 may have the same or different electrical function. The first-sixth semiconductor die 280 may have complementary operation, e.g. RF signal processing and external interface circuits.

Figure 16C:
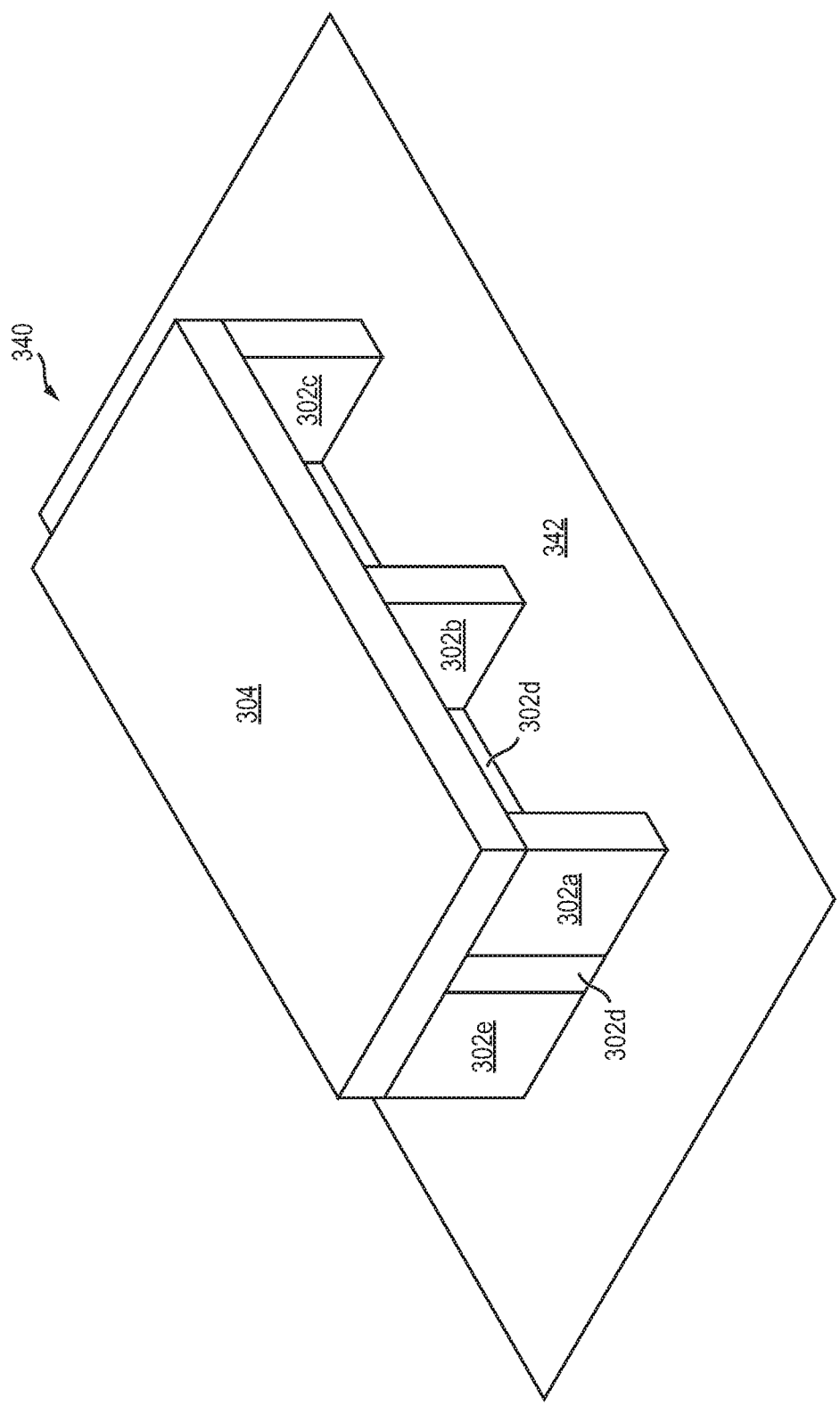

In FIG. 16c, horizontal component 304 is a seventh semiconductor die 280 implementing a seventh electrical function. Horizontal component 304 is mechanically and electrically connected to vertical components 302a-302g, as described in FIGS. 3b-3d, 4a-4b, 5a-5c, 6a-6b, 7a-7c, and 15a-15f. Horizontal component 304 is vertically offset from substrate 342. Vertical component 302d and horizontal component 304 provide electrical interconnect between vertical components 302a-302c and vertical components 302e-302g.

In other embodiments of FIGS. 16a-16c, vertical component 302a-302g can each be interconnect interposer 250, interconnect interposer 270, or semiconductor die 280. Horizontal component 304 can be interconnect interposer 250, interconnect interposer 270, or semiconductor die 280. In the present modular units functionality and interconnect scheme, a 3D semiconductor package can be quickly implemented by selecting the appropriate vertical components 302 and horizontal components 304 for the semiconductor package specification. Overall package configuration can remain relatively constant or repetitive, while functionality and interconnect can be quickly changed out to meet the package requirements. Alternatively, the semiconductor package configuration can be quickly changed with different combinations of vertical components 302 and horizontal components 340. Given any semiconductor package specification, the various combinations of vertical components 302 and horizontal components 304 implemented according to the standardized, modular units or building-block scheme can achieve both functionality and interconnect for any 3D package configuration in a time efficient and cost effective manner.

Figure 17:
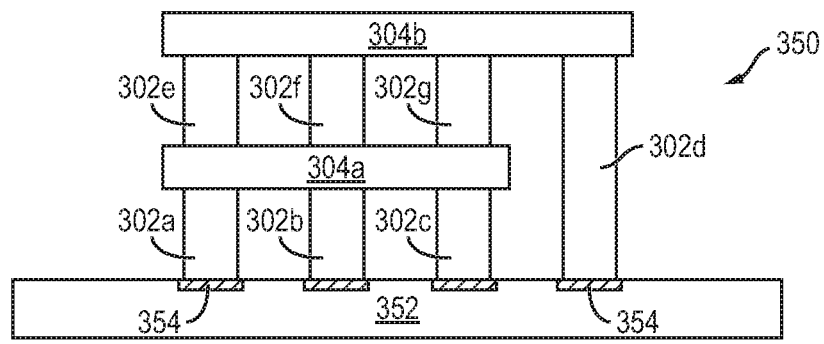
FIG. 17 illustrates another 3D semiconductor package with multi-level vertical components and horizontal components.

FIG. 17 shows a side view of a multi-level 3D semiconductor package 350 mounted to substrate or PCB 352 containing conductive layers 354 for electrical interconnect. In one embodiment, vertical component 302a is a first semiconductor die 280 implementing a first electrical function, vertical component 302b is a second semiconductor die 280 implementing a second electrical function, vertical component 302c is a third semiconductor die 280 implementing a third electrical function, and horizontal component 304b is a first interconnect interposer 250 or 270. Vertical component 302d is a fourth semiconductor die 280 implementing a fourth electrical function, vertical component 302e is a fifth semiconductor die 280 implementing a fifth electrical function, vertical component 302f is a sixth semiconductor die 280 implementing a sixth electrical function, vertical component 302g is a seventh semiconductor die 280 implementing a seventh electrical function, and horizontal component 304c is a second interconnect interposer 250 or 270. Vertical components 302a-302d are mechanically connected to substrate 352 and electrically connected to conductive layer 354. Horizontal component 304a is mechanically and electrically connected to vertical components 302a-302c, as described in FIGS. 3b-3d, 4a-4b, 5a-5c, 6a-6b, 7a-7c, and 15a-15f. Likewise, vertical components 302e-302g are mechanically and electrically connected to horizontal component 304a. Horizontal component 304b is mechanically and electrically connected to vertical components 302d-302g using bumps, wire bonds, conductive epoxy, or interlocking structure, as described in FIGS. 3b-3d, 4a-4b, 5a-5c, 6a-6b, 7a-7c, and 15a-15f. Accordingly, vertical components 302a-302g and horizontal components 304a-304b are arranged in a multi-level 3D semiconductor package 350. The first-seventh semiconductor die 280 may have the same or different electrical function. The first-seventh semiconductor die 280 may have complementary operation, e.g. memory and controller, or signal processing and external interface circuits.

In other embodiments of FIG. 17, vertical component 302a-302g can each be interconnect interposer 250, interconnect interposer 270, or semiconductor die 280. Horizontal components 304a-304b can be interconnect interposer 250, interconnect interposer 270, or semiconductor die 280. In the present modular units functionality and interconnect scheme, a 3D semiconductor package can be quickly implemented by selecting the appropriate vertical components 302 and horizontal components 304 for the semiconductor package specification. Given any semiconductor package specification, the various combinations of vertical components 302 and horizontal components 304 implemented according to the standardized, modular units scheme can achieve both functionality and interconnect for any 3D package configuration in a time efficient and cost effective manner.

Figure 18A:
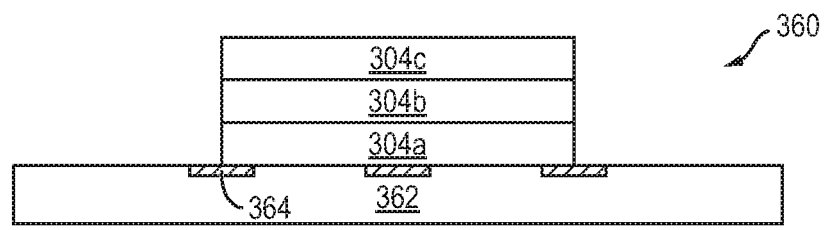
FIGS. 18a-18b illustrate another 3D semiconductor package with blocked vertical components and horizontal components.
Figure 18B:
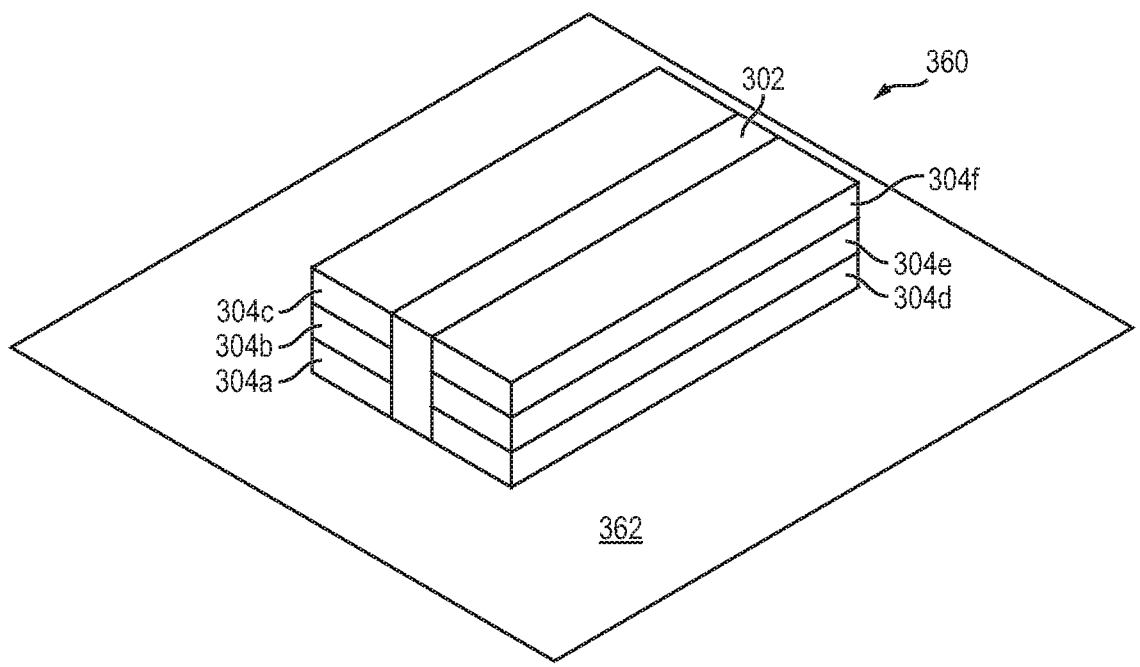

FIG. 18a shows a side view of a blocked 3D semiconductor package 360 mounted to substrate or PCB 362 containing conductive layers 364 for electrical interconnect. FIG. 18b is an orthogonal view of 3D semiconductor package 360 mounted to substrate 362. In one embodiment, horizontal component 304a is a first semiconductor die 280, horizontal component 304b is a second semiconductor die 280, and horizontal component 304c is a third semiconductor die 280. Horizontal component 304d is a fourth semiconductor die 280, horizontal component 304e is a fifth semiconductor die 280, and horizontal component 304f is a sixth semiconductor die 280. Vertical component 302 is an interconnect interposer 250 or 270. Horizontal components 304a and 304d and vertical component 302 are mechanically connected to substrate 362 and electrically connected to conductive layer 364. Horizontal components 304a-304c are mechanically and electrically connected to each other and to vertical component 302 using bumps, wire bonds, conductive epoxy, or interlocking structure, as described in FIGS. 3b-3d, 4a-4b, 5a-5c, 6a-6b, 7a-7c, and 15a-15f. Likewise, horizontal components 304d-304f are mechanically and electrically connected to each other and vertical component 302. In a closed or cube configuration of FIGS. 18*a*-18*b*, a major surface of horizontal component 304*a* contacts a major surface of horizontal component 304*b*, and a major surface of horizontal component 304*b* contacts a major surface of horizontal component 304*c*. The cube configuration is suited to space efficiency and maximizing circuit function density. The first-sixth semiconductor die 280 may have the same or different electrical function. The first-sixth semiconductor die 280 may have complementary operation, e.g. memory and controller, or signal processing and external interface circuits.

In other embodiments of FIGS. 18*a*-18*b*, horizontal components 304*a*-304*f* can each be interconnect interposer 250, interconnect interposer 270, or semiconductor die 280. Vertical component 302 can be interconnect interposer 250, interconnect interposer 270, or semiconductor die 280.

Figure 19A:
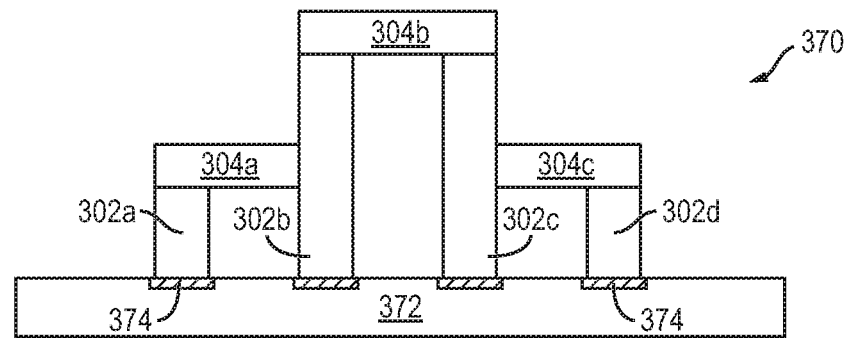
FIGS. 19a-19b illustrate another 3D semiconductor package with tiered vertical components and horizontal components.
Figure 19B:
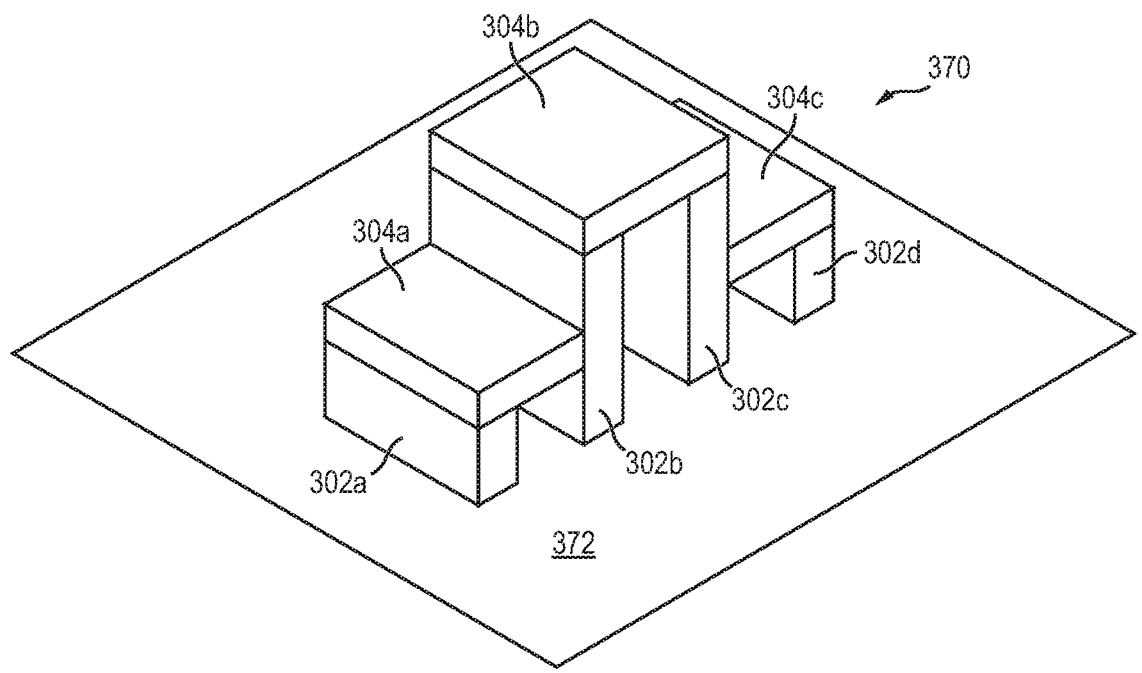

FIG. 19*a* shows a side view of a tiered 3D semiconductor package 370 mounted to substrate or PCB 372 containing conductive layers 374 for electrical interconnect. FIG. 19*b* is an orthogonal view of 3D semiconductor package 370 mounted to substrate 372. In one embodiment, vertical component 302*a* is a first semiconductor die 280, vertical component 302*b* is a second semiconductor die 280, vertical component 302*c* is a third semiconductor die 280, and vertical component 302*d* is a fourth semiconductor die 280. Horizontal component 304*a* is a first interconnect interposer 250 or 270, horizontal component 304*b* is a fifth semiconductor die 280, and horizontal component 304*c* is a second interconnect interposer 250 or 270. Vertical components 302*a*-302*d* are mechanically connected to substrate 372 and electrically connected to conductive layer 374. Horizontal components 304*a*-304*c* are mechanically and electrically connected to vertical components 302*a*-302*d* using bumps, wire bonds, conductive epoxy, or interlocking structure, as described in FIGS. 3*b*-3*d*, 4*a*-4*b*, 5*a*-5*c*, 6*a*-6*b*, 7*a*-7*c*, and 15*a*-15*f*. Likewise, vertical components 302*e*-302*g* are mechanically and electrically connected to horizontal component 304*a*. Horizontal component 304*b* is mechanically and electrically connected to vertical components 302*d*-302*g* using bumps, wire bonds, conductive epoxy, or interlocking structure, as described in FIGS. 3*b*-3*d*, 4*a*-4*b*, 5*a*-5*c*, 6*a*-6*b*, 7*a*-7*c*, and 15*a*-15*f*. Vertical components 302*b*-302*c* extend higher than vertical components 302*a* and 302*d*. Horizontal component 304*b* is vertically offset from horizontal components 304*a* and 304*c*. Accordingly, vertical components 302*a*-302*d* and horizontal components 304*a*-304*c* are arranged in a tiered 3D semiconductor package 370. The first-fifth semiconductor die 280 may have the same or different electrical function. The first-fifth semiconductor die 280 may have complementary operation, e.g. memory and controller, or signal processing and external interface circuits.

In other embodiments of FIGS. 19*a*-19*b*, vertical component 302*a*-302*d* can each be interconnect interposer 250, interconnect interposer 270, or semiconductor die 280. Horizontal components 304*a*-304*c* can be interconnect interposer 250, interconnect interposer 270, or semiconductor die 280. Given any semiconductor package specification, the various combinations of vertical components 302 and horizontal components 304 implemented according to the standardized, modular units scheme can achieve both functionality and interconnect for any 3D package configuration in a time efficient and cost effective manner.

Figure 20A:
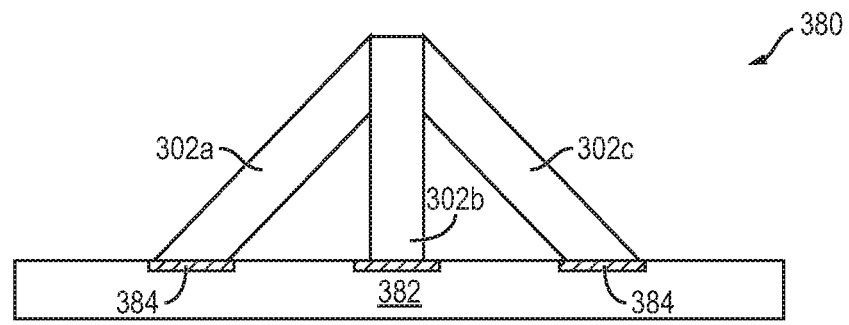
FIGS. 20a-20b illustrate another 3D semiconductor package with a horizontal component and vertical components on an angle.
Figure 20B:
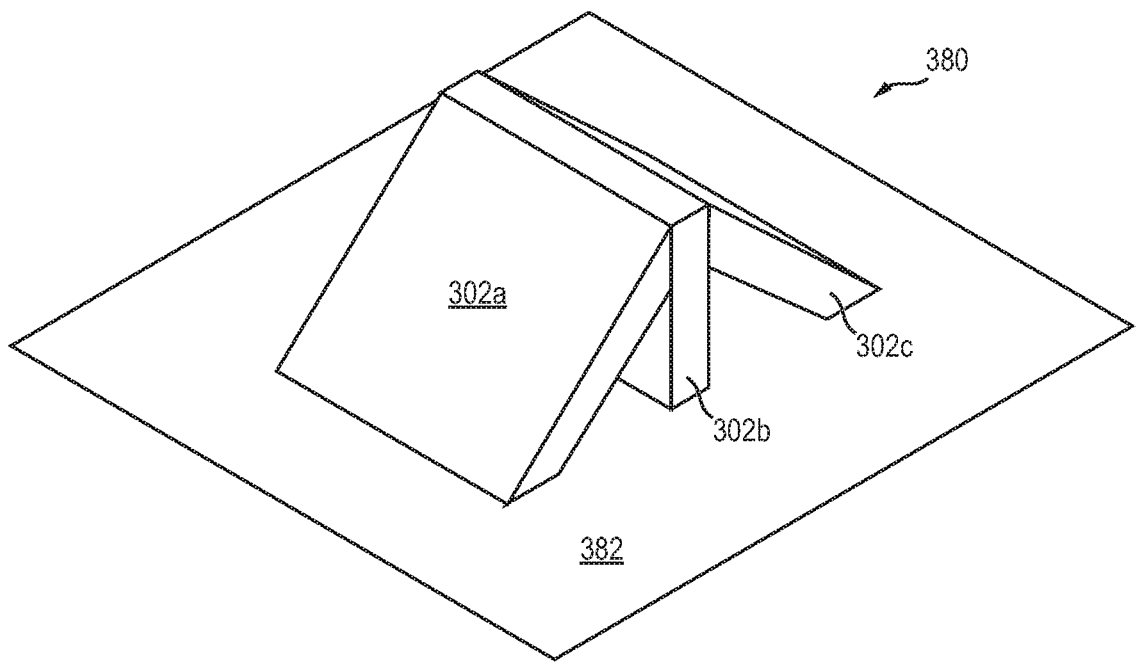

FIG. 20*a* shows a side view of an angled 3D semiconductor package 380 mounted to substrate or PCB 382 containing conductive layers 384 for electrical interconnect. FIG. 20*b* is an orthogonal view of 3D semiconductor package 380 mounted to substrate 382. In one embodiment, vertical component 302*a* is a first semiconductor die 280, vertical component 302*b* is an interconnect interposer 250 or 270, and vertical component 302*c* is a second semiconductor die 280. Vertical components 302*a*-302*c* are mechanically connected to substrate 382 and electrically connected to conductive layer 384. Vertical components 302*a* and 302*c* are mechanically and electrically connected to vertical component 302*b* using bumps, wire bonds, conductive epoxy, or interlocking structure, as described in FIGS. 3*b*-3*d*, 4*a*-4*b*, 5*a*-5*c*, 6*a*-6*b*, 7*a*-7*c*, and 15*a*-15*f*. Vertical components 302*a* and 302*c* are positioned on a 45° angle with respect to substrate 382. Accordingly, vertical components 302*a*-302*c* are arranged in an angled 3D semiconductor package 370. The first-second semiconductor die 280 may have the same or different electrical function. The first-second semiconductor die 280 may have complementary operation, e.g. memory and controller, or signal processing and external interface circuits.

In other embodiments of FIGS. 20*a*-20*b*, vertical component 302*a*-302*c* can each be interconnect interposer 250, interconnect interposer 270, or semiconductor die 280.

In summary, a 3D semiconductor package can be implemented using a standardized, modular units or building-block package integration scheme to simplify electrical interconnect and structural configuration for many different semiconductor die. The 3D semiconductor package includes vertical components and horizontal components implemented as interconnect interposers and semiconductor die. The interconnect interposer represents a standardized fixed or programmable electrical routing scheme. The semiconductor die can provide any electrical function and, in combination with the interconnect interposers, can achieve any 3D package configuration in a time efficient and cost effective manner as the vertical components and horizontal components are connected together as modular units in a standardized package integration scheme. Each vertical component and horizontal component includes mechanical and electrical interlocking arrangement, e.g. protrusions and recesses for standardized and reliable interconnect.

While one or more embodiments have been illustrated and described in detail, the skilled artisan will appreciate that modifications and adaptations to those embodiments may be made without departing from the scope of the present disclosure.

What is claimed:

1. A method of making a semiconductor device, comprising:
providing a first substrate and a second substrate;
providing a third substrate including an active surface; and
coupling a side surface of the first substrate substantially perpendicular to a major surface of the third substrate; and
coupling a side surface of the second substrate substantially perpendicular to a major surface of the third substrate;
wherein a major surface of the first substrate is substantially parallel with and separated from a major surface of the second substrate in an open configuration to achieve fluid flow.

2. The method of claim 1, wherein the first substrate and the second substrate include an interconnect interposer or a semiconductor die.

3. The method of claim 2, further including:
forming a conductive via through the interconnect interposer; and
forming a conductive layer through the interconnect interposer.

4. The method of claim 2, wherein the interconnect interposer is programmable.

5. The method of claim 1, wherein the active surface of the third substrate includes a semiconductor die.

6. A method of making a semiconductor device, comprising:
forming a 3D semiconductor package with a plurality of interconnected modular units, wherein a first modular unit comprising a major surface is coupled between a second modular unit and a third modular unit each with a major surface oriented substantially perpendicular to the first modular unit, the first modular unit including an active circuit; and
electrically connecting the modular units through one or more conduction paths within the first modular unit, the second modular unit, and the third modular unit;
wherein the major surfaces of the second modular unit are separated from each other by a fluid; and
wherein the major surfaces of the third modular unit are separated from each other by the fluid.

7. The method of claim 6, wherein the second modular unit includes one or more interconnect interposers or one or more semiconductor dies.

8. The method of claim 7, further including:
forming a conductive via through the interconnect interposer; and
forming a conductive layer through the interconnect interposer.

9. The method of claim 7, wherein the interconnect interposer is programmable.

10. The method of claim 6, wherein the first modular unit includes an interconnect interposer or a semiconductor die.

11. The method of claim 6, further including forming the 3D semiconductor package with multiple tiers of modular units.

12. A method of making a semiconductor device, comprising:
coupling a side surface of a first component substantially perpendicular to a major surface of a second component forming a T-shape;
wherein the first component comprises a first active circuit;
wherein the second component comprises a second active circuit; and
wherein the first component is interconnected to the second component to form a 3D semiconductor package.

13. The method of claim 12, further including providing a third component positioned substantially parallel to the first component and interconnected to the second component, wherein the third component includes an interconnect interposer or a semiconductor die.

14. The method of claim 13, further including:
forming a conductive via through the interconnect interposer; and
forming a conductive layer through the interconnect interposer.

15. The method of claim 13, wherein the interconnect interposer is programmable.

16. The method of claim 12, further including providing a fourth component interconnected substantially perpendicularly to the first component, wherein the fourth component includes an interconnect interposer or a semiconductor die.

17. The method of claim 12, wherein the 3D semiconductor package includes multiple tiers of the first component and the second component.

* * * * *